(12) United States Patent
Zhao et al.

(10) Patent No.: US 11,887,945 B2
(45) Date of Patent: Jan. 30, 2024

(54) SEMICONDUCTOR DEVICE WITH ISOLATION AND/OR PROTECTION STRUCTURES

(71) Applicant: Wolfspeed, Inc., Durham, NC (US)

(72) Inventors: Lei Zhao, Chandler, AZ (US); Fabian Radulescu, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 361 days.

(21) Appl. No.: 17/039,043

(22) Filed: Sep. 30, 2020

(65) Prior Publication Data

US 2022/0102294 A1 Mar. 31, 2022

(51) Int. Cl.

| | |
|---|---|
| H01L 23/66 | (2006.01) |
| H01L 23/528 | (2006.01) |
| H01L 23/552 | (2006.01) |
| H01L 27/06 | (2006.01) |
| H01L 29/06 | (2006.01) |
| H01L 29/20 | (2006.01) |
| H01L 29/778 | (2006.01) |
| H01L 29/78 | (2006.01) |
| H03F 3/21 | (2006.01) |
| H03F 1/02 | (2006.01) |
| H01L 23/48 | (2006.01) |

(52) U.S. Cl.
CPC .......... *H01L 23/66* (2013.01); *H01L 23/481* (2013.01); *H01L 23/5286* (2013.01); *H01L 23/552* (2013.01); *H01L 27/0605* (2013.01); *H01L 29/0642* (2013.01); *H01L 29/2003* (2013.01); *H01L 29/7786* (2013.01); *H01L 29/7816* (2013.01); *H03F 1/0288* (2013.01); *H03F 3/211* (2013.01); *H01L 2223/6611* (2013.01); *H01L 2223/6616* (2013.01); *H01L 2223/6655* (2013.01); *H01L 2223/6683* (2013.01)

(58) Field of Classification Search
None
See application file for complete search history.

(56) References Cited

U.S. PATENT DOCUMENTS

| 3,430,110 | A | * | 2/1969 | Goshgarian | ........... H01L 21/761 438/383 |
| 3,471,754 | A | * | 10/1969 | Kinji | ................. H01L 21/76297 438/459 |
| 3,559,283 | A | * | 2/1971 | Kravitz | ................... H01L 24/01 156/1 |
| 3,602,981 | A | * | 9/1971 | Kooi | ................... H01L 21/8222 257/E27.111 |

(Continued)

OTHER PUBLICATIONS

"Deep Trench Isolated CMOS Devices" by Rung et al. (Year: 1982).*

*Primary Examiner* — Evren Seven
(74) *Attorney, Agent, or Firm* — COATS & BENNETT, PLLC

(57) ABSTRACT

The present disclosure relates to a semiconductor device with isolation and/or protection structures. A semiconductor device can include a substrate, a first transistor and a second transistor, wherein the first transistor and the second transistor are formed on the substrate, and an isolation structure formed on the substrate. The isolation structure can be formed on the substrate between the first transistor and the second transistor. The isolation structure can be configured to isolate the first transistor and the second transistor.

26 Claims, 19 Drawing Sheets

(56) References Cited

U.S. PATENT DOCUMENTS

| | | | |
|---|---|---|---|
| 3,622,382 A * | 11/1971 | Brack | H01L 23/29 438/311 |
| 3,892,608 A * | 7/1975 | Kuhn | H01L 21/32134 257/E21.309 |
| 4,037,306 A * | 7/1977 | Gutteridge | H01L 21/76877 257/586 |
| 4,051,506 A * | 9/1977 | Horie | H01L 21/76232 257/E21.549 |
| 4,104,086 A * | 8/1978 | Bondur | H01L 21/3065 257/E21.232 |
| 4,274,909 A * | 6/1981 | Venkataraman | H01L 21/0338 438/296 |
| 4,609,934 A * | 9/1986 | Haskell | H01L 21/76232 257/E21.549 |
| 4,830,980 A * | 5/1989 | Hsieh | H01L 27/095 257/283 |
| 4,946,547 A | 8/1990 | Palmour et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| RE34,861 E | 2/1995 | Davis et al. | |
| 5,393,993 A | 2/1995 | Edmond et al. | |
| 5,523,589 A | 6/1996 | Edmond et al. | |
| 5,828,120 A * | 10/1998 | Ishikawa | H01L 27/0688 257/E21.574 |
| 6,100,589 A * | 8/2000 | Tanaka | H01L 24/05 257/E23.152 |
| 6,218,680 B1 | 4/2001 | Carter, Jr. et al. | |
| 6,316,793 B1 | 11/2001 | Sheppard et al. | |
| 6,509,622 B1 * | 1/2003 | Ma | H01L 21/76838 257/E21.582 |
| 6,548,333 B2 | 4/2003 | Smith | |
| 7,008,861 B2 * | 3/2006 | Andrews | B23K 26/53 257/E21.599 |
| 7,030,428 B2 | 4/2006 | Saxler | |
| 7,045,404 B2 | 5/2006 | Sheppard et al. | |
| 7,544,963 B2 | 6/2009 | Saxler | |
| 7,548,112 B2 | 6/2009 | Sheppard | |
| 7,592,211 B2 | 9/2009 | Sheppard et al. | |
| 7,615,774 B2 | 11/2009 | Saxler | |
| 7,709,269 B2 | 5/2010 | Smith et al. | |
| 7,936,052 B2 * | 5/2011 | Barth | H01L 23/552 257/691 |
| 8,049,252 B2 | 11/2011 | Smith et al. | |
| 8,120,064 B2 | 2/2012 | Parikh et al. | |
| 8,357,996 B2 * | 1/2013 | Mieczkowski | H01L 21/78 438/460 |
| 9,831,304 B1 * | 11/2017 | Yap | H01L 21/76224 |
| 9,947,616 B2 | 4/2018 | Wood et al. | |
| 2001/0006244 A1 * | 7/2001 | Shimizu | H01L 27/11526 438/296 |
| 2003/0020070 A1 * | 1/2003 | Rockwell | H01L 21/02439 257/E27.012 |
| 2005/0026397 A1 * | 2/2005 | Daubenspeck | H01L 21/78 257/E21.309 |
| 2005/0098893 A1 * | 5/2005 | Tsutsue | H01L 23/5226 257/E23.142 |
| 2005/0179213 A1 * | 8/2005 | Huang | H01L 23/564 277/620 |
| 2006/0076651 A1 * | 4/2006 | Tsutsue | H01L 23/564 257/669 |
| 2007/0066039 A1 * | 3/2007 | Agarwal | H01L 21/0495 438/534 |
| 2007/0176288 A1 * | 8/2007 | Daubenspeck | H01L 24/29 257/737 |
| 2008/0073747 A1 * | 3/2008 | Chao | H01L 25/0657 257/E21.628 |
| 2008/0204140 A1 * | 8/2008 | Kikkawa | H01L 29/66462 257/191 |
| 2008/0230874 A1 * | 9/2008 | Yamada | H01L 21/78 257/E23.002 |
| 2010/0188147 A1 * | 7/2010 | Blednov | H03F 1/08 330/124 R |
| 2011/0049530 A1 * | 3/2011 | Dhar | H01L 29/36 257/77 |
| 2011/0147764 A1 * | 6/2011 | Dhar | H01L 29/66068 257/E21.336 |
| 2012/0139080 A1 * | 6/2012 | Wang | H01L 28/91 257/532 |
| 2013/0323903 A1 * | 12/2013 | Fenouillet-Beranger | H01L 21/76229 438/424 |
| 2014/0145191 A1 * | 5/2014 | Arnold | H01L 22/34 438/18 |
| 2014/0246699 A1 * | 9/2014 | Radulescu | H01L 29/42364 257/194 |
| 2014/0361341 A1 * | 12/2014 | Sriram | H01L 29/778 257/194 |
| 2014/0361342 A1 * | 12/2014 | Sriram | H01L 29/7787 257/194 |
| 2019/0172769 A1 * | 6/2019 | Hardiman | H01L 23/53209 |
| 2020/0381422 A1 * | 12/2020 | Otake | H01L 21/76224 |
| 2021/0083085 A1 * | 3/2021 | Chang | H01L 27/0605 |
| 2021/0296452 A1 * | 9/2021 | Hanson | H01L 29/7786 |

* cited by examiner

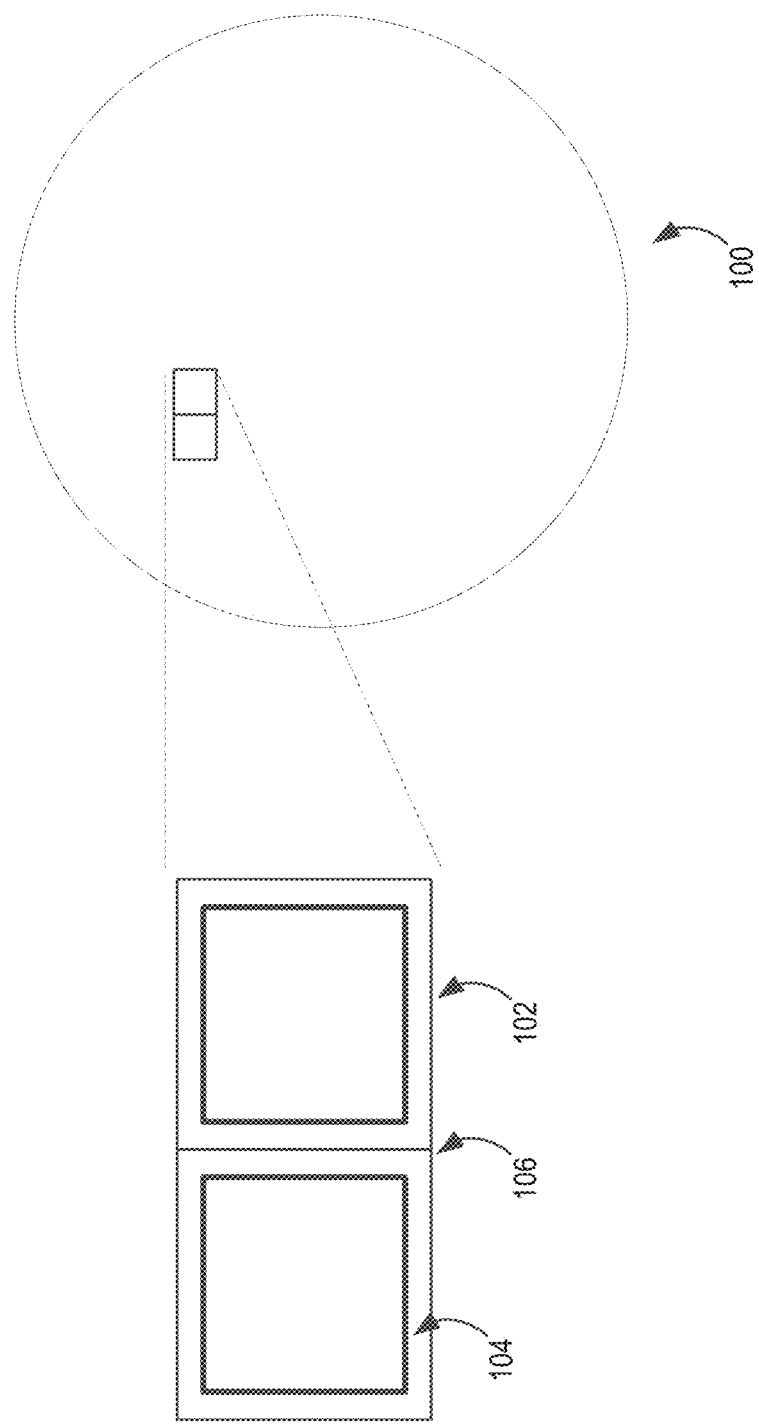

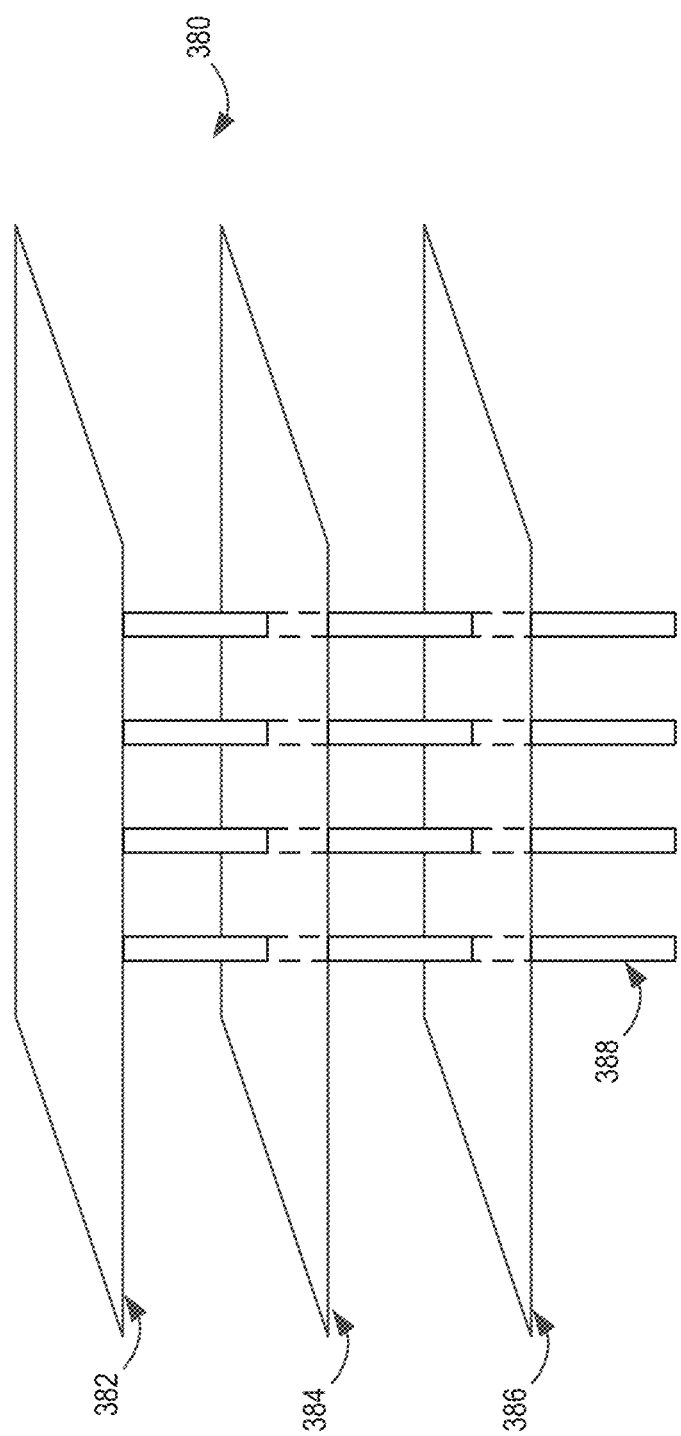

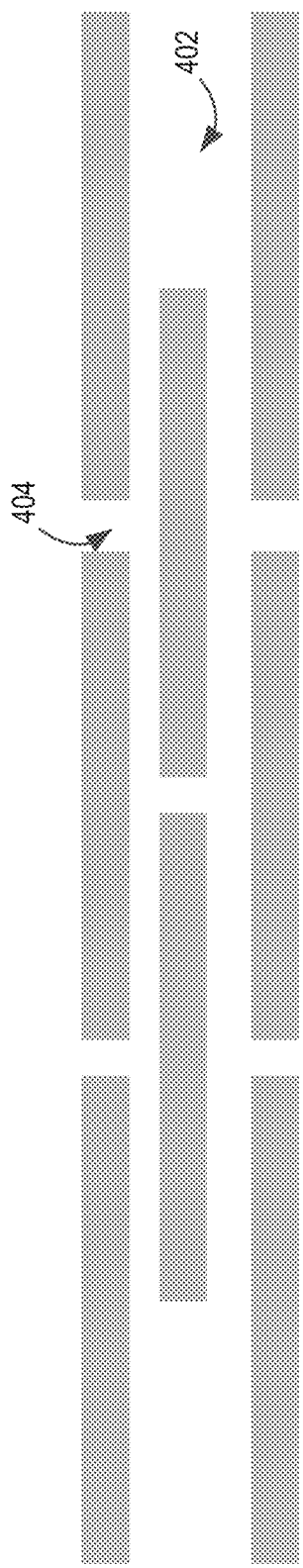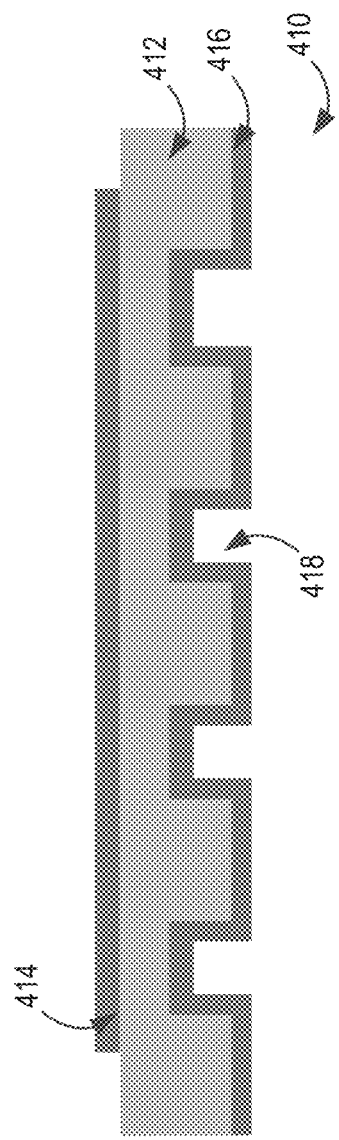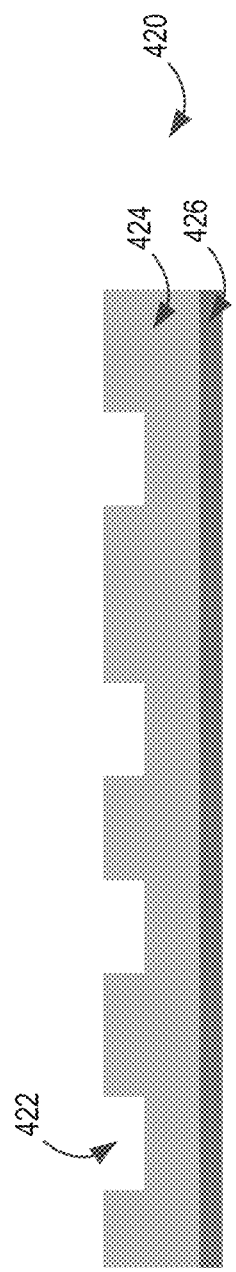

SEMICONDUCTOR DEVICE WITH ISOLATION AND/OR PROTECTION STRUCTURES

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

RF amplifiers are widely used in cellular communications systems and other applications. RF amplifiers are typically formed as semiconductor integrated circuit chips. Most RF amplifiers are implemented in silicon or using wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as GaN-based compounds AlGaN and AlInGaN. These compounds have empirical formulas in which one mole of nitrogen is combined with a total of one mole of the Group III elements.

Silicon-based RF amplifiers are typically implemented using laterally diffused metal oxide semiconductor ("LDMOS") transistors. Silicon LDMOS RF amplifiers can exhibit high levels of linearity and may be relatively inexpensive to fabricate. Group III nitride-based RF amplifiers are typically implemented using High Electron Mobility Transistors ("HEMT") and are primarily used in applications requiring high power and/or high frequency operation where LDMOS transistor amplifiers may have inherent performance limitations.

RF amplifiers may include one or more amplification stages, with each stage typically implemented as a transistor amplifier. In order to increase the output power and current handling capabilities, RF amplifiers are typically implemented in a "unit cell" configuration in which a large number of individual "unit cell" transistors are arranged electrically in parallel. The RF amplifier may be implemented as a single integrated circuit chip or "die," or may include a plurality of dies. When multiple RF amplifier die are used, they may be connected in series and/or in parallel.

RF amplifiers often include matching circuits, such as impedance matching circuits, that are designed to improve the impedance match between an RF amplifier die and transmission lines connected thereto for RF signals at the fundamental operating frequency and harmonic termination circuits that are designed to at least partly terminate harmonics that may be generated during device operation such as second and third order harmonics. The RF amplifier die(s) as well as the impedance matching and harmonic termination circuits may be enclosed in a package. Electrical leads may extend from the package that are used to electrically connect the RF amplifier to external circuit elements such as input and output RF transmission lines and bias voltage sources.

As noted above, Group III nitride-based RF amplifiers are often used in high power and/or high frequency applications. Typically, high levels of heat are generated within the Group III nitride-based RF amplifier die(s) during operation. If the RF die(s) become too hot, the performance (e.g., output power, efficiency, linearity, gain, etc.) of the RF amplifier may deteriorate and/or the RF amplifier die(s) may be damaged. As such, Group III nitride-based RF amplifiers are typically mounted in packages that may be optimized for heat removal.

FIG. 1A is a schematic top view of a wafer 100 from which multiple silicon LDMOS die 102 will be singulated. Each silicon die 102 have a conventional edge seal 104 around the perimeter of each transistor to protect the edges of the dies 102 from chipping or cracking during the singulation or separation process from propagating into the active area of the die and prevents contamination from impurities and moisture in the active area of the transistor. Typically, the dies 102 are separated using a saw (not shown) to cut the die 102 along streets 106. Because they are adjacent dies 102 on the same wafer 100, the transistors can have matching characteristics, such as a matching threshold voltage. However, once the dies 102 are sawn, there is no guarantee in the assembly process that these two singulated dies 102 will be used in the same multi-transistor amplifier. In the case of asymmetrical amplifiers, such as an asymmetrical Doherty amplifier, the main and peaking transistors can have different peripheries and can come from different wafers. Without additional testing, matching the characteristics of the singulated dies 102 can be time intensive and cost ineffective.

FIG. 1B is a schematic top view of a Doherty amplifier 120 comprising an edge seal 122 around the perimeter of a silicon based LDMOS main transistor die 126 and an edge seal 124 around a silicon based LDMOS peaking transistor die 128. As mentioned above, dies 126 and 128 have edge seals 122, 124 around the perimeter of each die to provide a mechanical reinforcement for the more fragile silicon-based transistors 126, 128 during the singulation process. Unfortunately, after singulation and the subsequent assembly process, the main and peaking die 126 and 128 are not guaranteed to have matching characteristics.

FIG. 1C is a schematic top view of a Doherty amplifier 140 comprising a discrete GaN based high electron mobility transistor (HEMT) main transistor die 142 and a discrete GaN based HEMT peaking transistor die 144. Since GaN based transistors (formed on a silicon carbide substrate) are much harder and mechanically robust, an edge seal is not used to protect the die 142 and 144 during the singulation process. Again, after singulation and the subsequent assembly process, the main and peaking die 142 and 144 are not guaranteed to have matching characteristics.

To ensure that the main and peaking transistors have matching characteristics, transistors that are grown adjacent to each other on a wafer can be maintained together on a single die. As shown, FIG. 1D is a schematic top view of a Doherty amplifier 160 with a main GaN based HEMT 164 and a peaking GaN based HEMT 166 formed as a single monolithic die 162. Again, since the GaN based die are more robust, and edge seal is not used to improve mechanical integrity during the singulation or separation process. However, since the transistors 164 and 166 are on the same die, there is an increased potential for the transistors to interfere with each other.

FIG. 1E is a schematic top view of a Doherty amplifier comprising a monolithic die 180 having a silicon based LDMOS main transistor 186 and a silicon based LDMOS peaking transistor 188. Being silicon-based, the monolithic die 180 uses an edge seal 182 around the perimeter of the die

180 where the die 180 was sawn from the wafer. Again, since the transistors 186 and 188 are on the same die 180, there is an increased potential for the transistors to interfere with each other.

BRIEF SUMMARY

Embodiments of the present disclosure generally relate to edge seal structures and isolation structures for single die amplifiers.

In particular, one or more embodiments include a semiconductor device including a substrate, a first transistor and a second transistor, wherein the first transistor and the second transistor are formed on the substrate, and an isolation structure formed on the substrate. The isolation structure can be formed on the substrate between the first transistor and the second transistor. The isolation structure can be configured to isolate the first transistor and the second transistor In some embodiments, the isolation structure can include at least one metal layer on the front side of the substrate. In some embodiments, the isolation structure can include at least one recess in the substrate. For example, the isolation structure can include on-die wire bonds and/or off-die wire bonds.

In some embodiments, the isolation structure is a metal isolation structure.

In some embodiments, the metal isolation structure can include at least one metal layer on the front side of the substrate. In some embodiments, the metal isolation structure comprises at least two rows of metal layers formed on the substrate. For example, the rows can be staggered. In some embodiments, the semiconductor device can further include at least one via through the substrate connected to a grounding element. In some embodiments, the isolation structure can include on-die wire bonds on the front side of the dielectric layer. For example, the on-die wire bonds are attached to grounded pads. In some embodiments, the semiconductor die can further include a backside metal layer.

In some embodiments, the semiconductor device can further include a third transistor formed on the substrate and a second metal isolation structure. The second metal isolation structure can be formed between the second transistor and the third transistor. The second metal isolation structure can be configured to isolate the second transistor and the third transistor.

In some embodiments, the isolation structure is a recessed isolation structure.

In some embodiments, the recessed isolation structure can include at least two rows of recesses in the substrate. In some embodiments, the rows can be staggered. In some embodiments, the recessed isolation structure can be formed on the front side of the substrate and/or the back side of the substrate. In some embodiments, the semiconductor device can further include a metal layer on the front side of the substrate and/or the back side of the substrate.

In some embodiments, the semiconductor device further includes a Doherty amplifier wherein the first transistor is a main transistor and the second transistor is a peaking transistor. For example, the main and peaking transistors are a GaN-based High Electron Mobility Transistors ("HEMT"). In some embodiments, the first and second transistors are laterally diffused metal oxide semiconductor ("LDMOS") transistors. In some embodiments, the semiconductor device is part of a package. In some embodiments, the semiconductor device operates at a frequency between 0.5 GHz and 1 GHz. In some embodiments, the semiconductor device operates at a frequency of approximately 3 GHz. In some embodiments, the semiconductor device operates at a frequency of approximately 10 GHz. In some embodiments, the semiconductor device operates at a frequency between 12 GHz and 18 GHz. In some embodiments, the semiconductor device operates at a frequency between 18 GHz and 27 GHz. In some embodiments, the semiconductor device operates at a frequency between 27 GHz and 40 GHz. In some embodiments, the isolation structure surrounds at least one transistor. In some embodiments, the isolation structure covers a portion of the width of the semiconductor device. In some embodiments, the isolation structure covers the width of the semiconductor device. In some embodiments, the isolation structure is comprised of a metal isolation structure and a recessed isolation structure.

One or more other embodiments include a Group III nitride-based semiconductor device, including a Group III nitride High Electron Mobility Transistors ("HEMT") die, and a protection structure around a perimeter of the Group III nitride die.

In some embodiments, the Group III nitride HEMT die is a monolithic die including at least a first and second Group III nitride transistor. In some embodiments, the protection structure is between the first and second transistors.

Of course, those skilled in the art will appreciate that the present embodiments are not limited to the above contexts or examples, and will recognize additional features and advantages upon reading the following detailed description and upon viewing the accompanying drawings.

BRIEF DESCRIPTION OF THE DRAWINGS

FIG. 1A is a schematic top view of a conventional wafer with multiple singulated dies.

FIG. 3C is a three-dimensional view of an isolation layer.

FIG. 4A is a schematic top view of an isolation layer.

FIG. 4B is a schematic cross section view of an isolation layer.

FIG. 4C is an alternative schematic cross section view of an isolation layer.

DETAILED DESCRIPTION

Figure 1C:
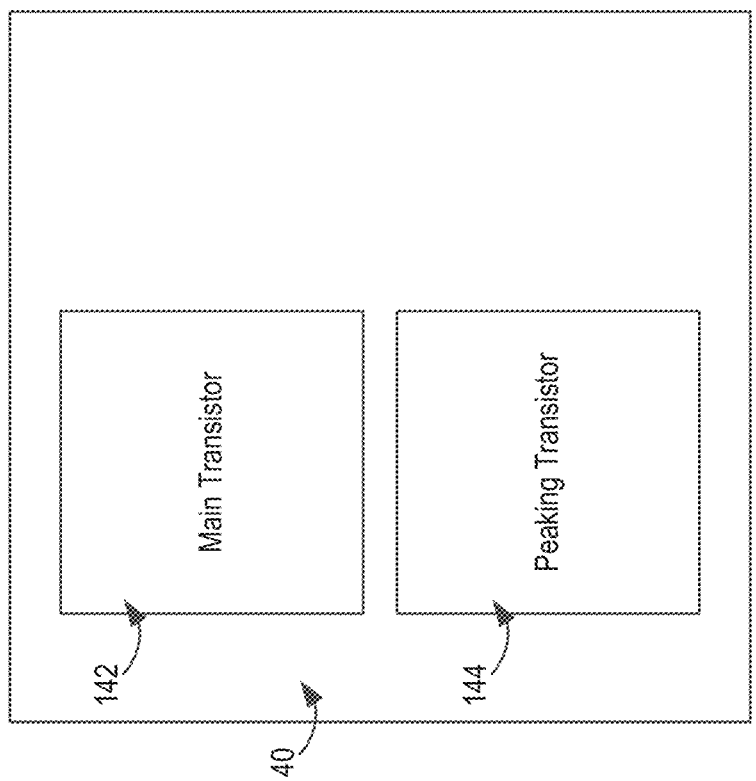
FIG. 1C is a schematic top view of a conventional amplifier having two transistors.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Certain embodiments can be utilized in the structure described in FIGS. 1A-E. However, other embodiments are possible. For example, different packaging structures can be used. Also, different chip structures can be utilized with source and/or drain vias, no vias, and/or additional or intervening epitaxial layers. Additionally, the matching GaN HEMTs can be discrete transistors, and additional matching and/or harmonic termination or other discrete circuitry can be packaged with the GaN HEMTs, e.g., as main and peak transistors in a Doherty amplifier package. Alternatively, the transistors can be formed together with other circuitry on the same substrate as part of a monolithic microwave integrated circuit (MIMIC).

Figure 2A:
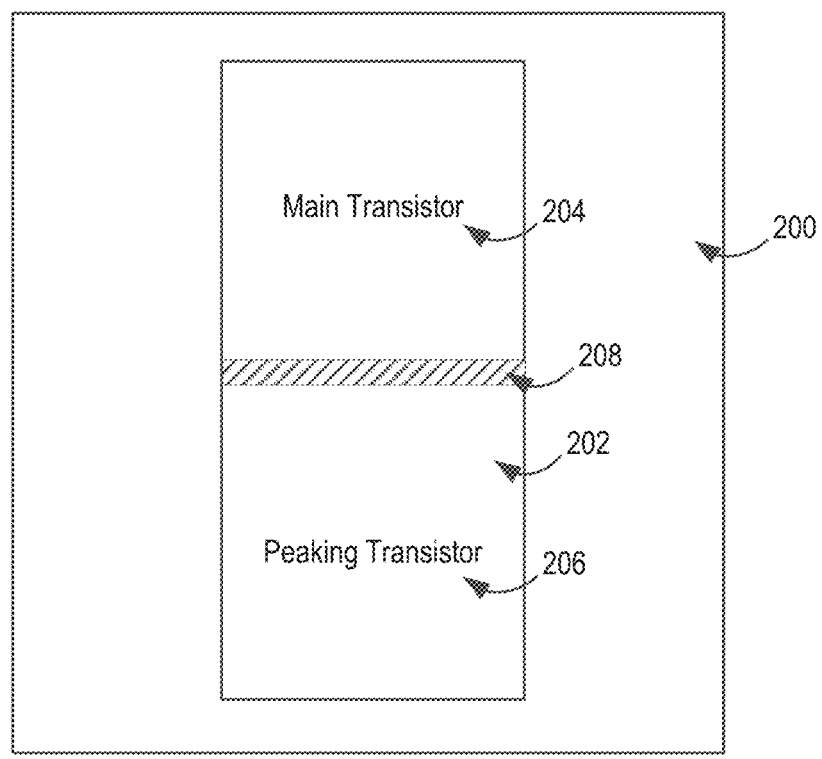
FIG. 2A is a schematic top view of an amplifier formed on one die according to an embodiment of the invention.

FIG. 2A is a schematic top view of an amplifier 202 formed on one die 200 according to an embodiment of the invention. Like the amplifier 162 in FIG. 1D, the amplifier 202 has a main transistor 204 and a peaking transistor 206. The amplifier 202 has an isolation structure 208 formed between the main transistor 204 and the peaking transistor 206. The isolation structure 208 is configured to isolate the main transistor 204 and the peaking transistor 206. Although shown being completely across the amplifier 202 between the main transistor 204 and the peaking transistor 206, the isolation structure 208 can be formed to cover a portion of the width of the amplifier 202.

Figure 1B:
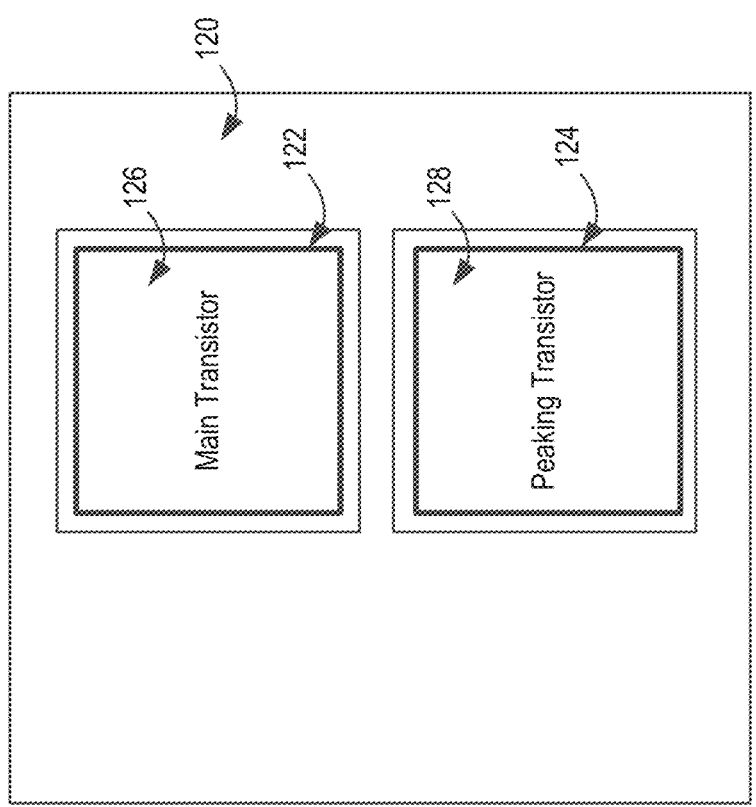
FIG. 1B is a schematic top view of a conventional amplifier having two transistors.
Figure 1E:
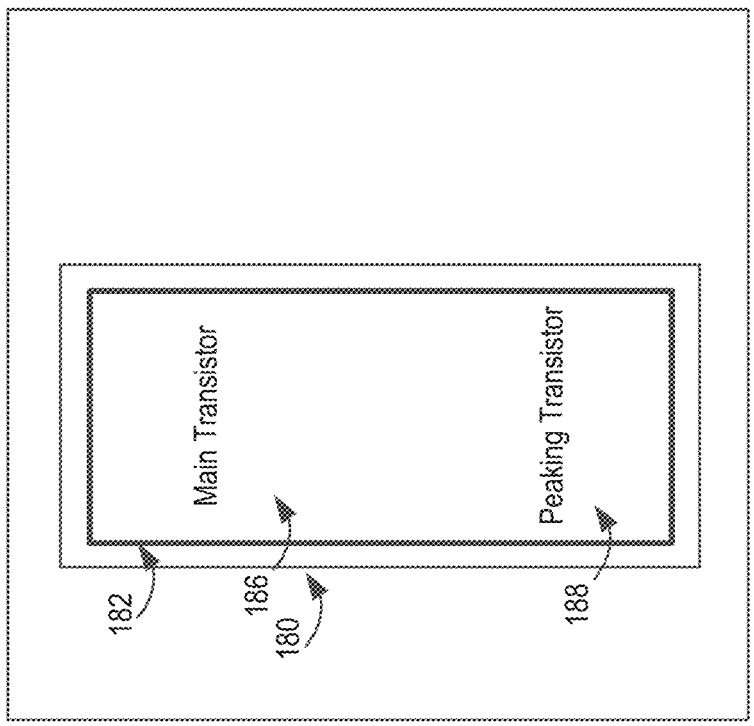
FIG. 1E is a schematic top view of a conventional amplifier having two transistors.
Figure 1D:
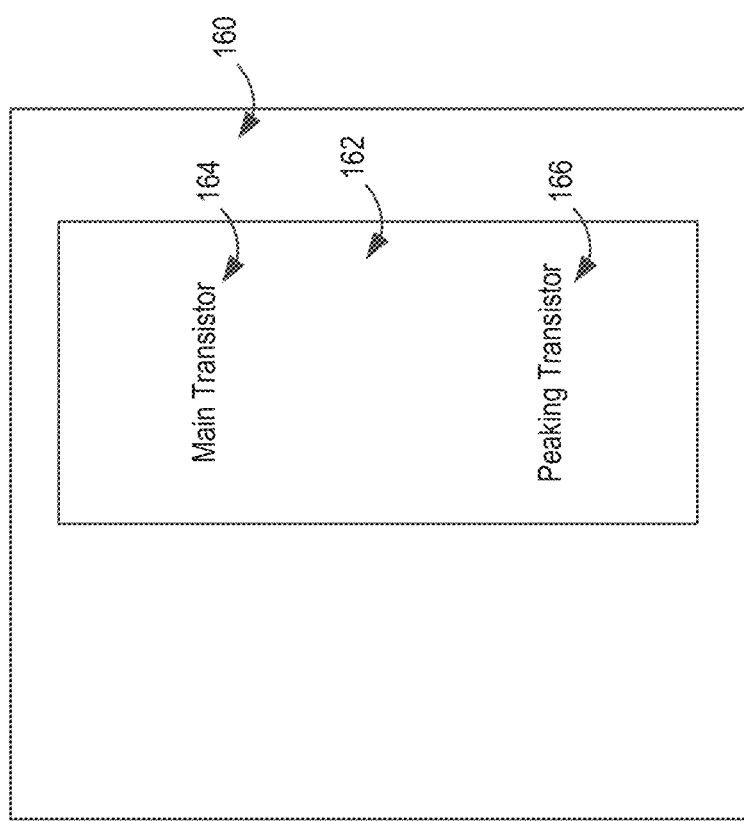
FIG. 1D is a schematic top view of a conventional amplifier having two transistors.
Figures 2B, 2C, 2D:
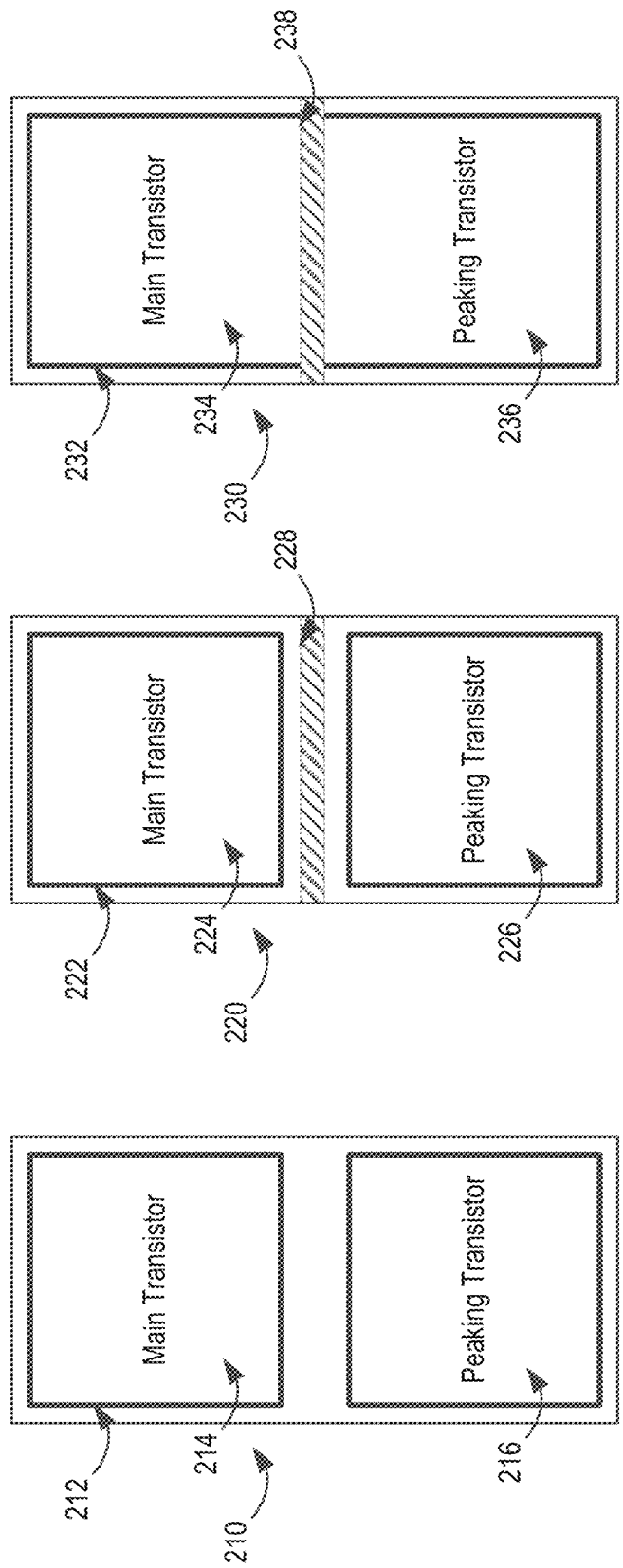
FIG. 2B is a schematic top view of an amplifier formed on one die according to an embodiment of the invention.
FIG. 2C is a schematic top view of an amplifier formed on one die according to an embodiment of the invention.
FIG. 2D is a schematic top view of an amplifier formed on one die according to an embodiment of the invention.

FIG. 2B is a schematic top view of an amplifier 210 according to an embodiment of the invention. The amplifier 210 includes a main transistor 214 and a peaking transistor 216, each having an isolation structure 212 around its perimeter. The isolation structure can be similar to the edge seal as shown in FIG. 1B, except that the amplifier 210 is not sawn to divide the transistors.

FIG. 2C is a schematic top view of an amplifier 220 according to an embodiment of the invention. The amplifier 220 includes a main transistor 224 and a peaking transistor 226, each having a perimeter isolation structure 222 around its perimeter. The amplifier 220 can also have a dividing isolation structure 228 between the main transistor 224 and the peaking transistor 236 as is shown in FIG. 2A. Although shown being completely across the amplifier 222 between the main transistor 224 and the peaking transistor 226, the dividing isolation structure 228 can be formed to cover a portion of the width of the amplifier 222.

FIG. 2D is a schematic top view of an amplifier 230 according to an embodiment of the invention. In FIG. 2D, the amplifier 230 has a main transistor 234 and a peaking transistor 236 that have a perimeter isolation structure 232 around both transistors 234, 236. Like FIGS. 2A and 2C, the amplifier 230 has a dividing isolation structure 238. In some embodiments, the dividing isolation structure 238 and the perimeter isolation structure 232 can be formed out of the same materials. In some embodiments, the isolation structures 232, 238 can be formed at the same time. In some embodiments, the isolation structures 232, 238 can be formed from separate materials. In some embodiments, the isolation structures 232, 238 can be one isolation structure. Although shown being completely across the amplifier 232 between the main transistor 234 and the peaking transistor 236, the dividing isolation structure 238 can be formed to cover a portion of the width of the amplifier 232.

Figure 2F:
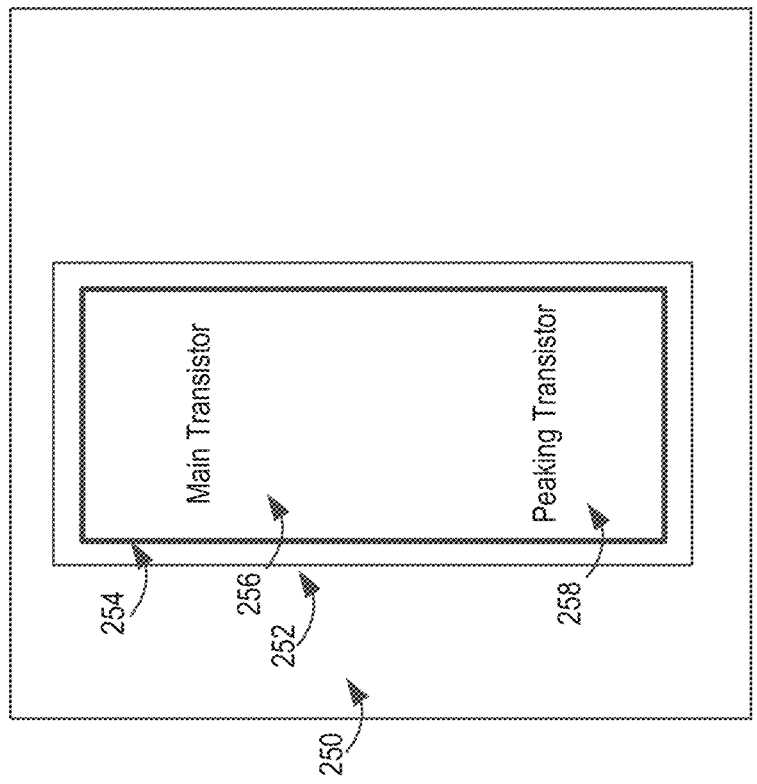
FIG. 2F is a schematic top view of an amplifier formed on one die according to an embodiment of the invention.
Figure 2E:
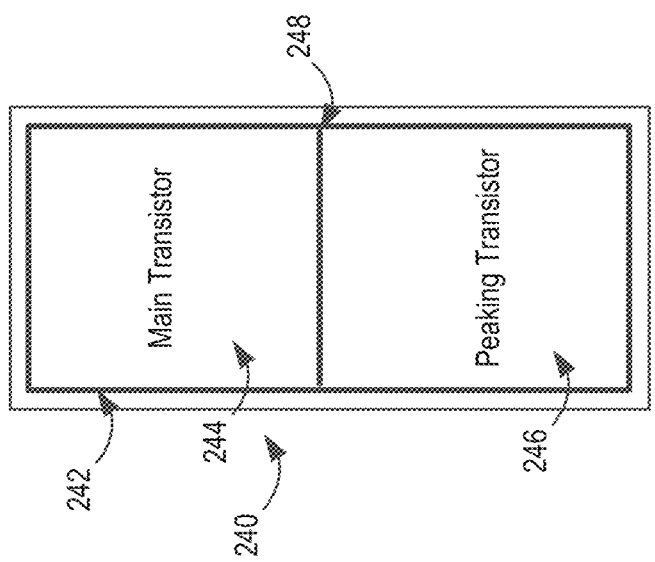
FIG. 2E is a schematic top view of an amplifier formed on one die according to an embodiment of the invention.

FIG. 2E is a schematic top view of an amplifier 240 according to an embodiment of the invention. The amplifier 240 has a main transistor 244 and a peaking transistor 246. The transistors 244, 246 are surrounded by an isolation structure 248. The isolation structure is formed around the individual perimeters of the transistors 244, 246 and join in between the transistors 244, 246.

FIG. 2F is a schematic top view of Doherty amplifier 250 on a single die 252 with an isolation layer 254 around the perimeters of both the main transistor 256 and the peaking transistor 258.

Figure 2G:
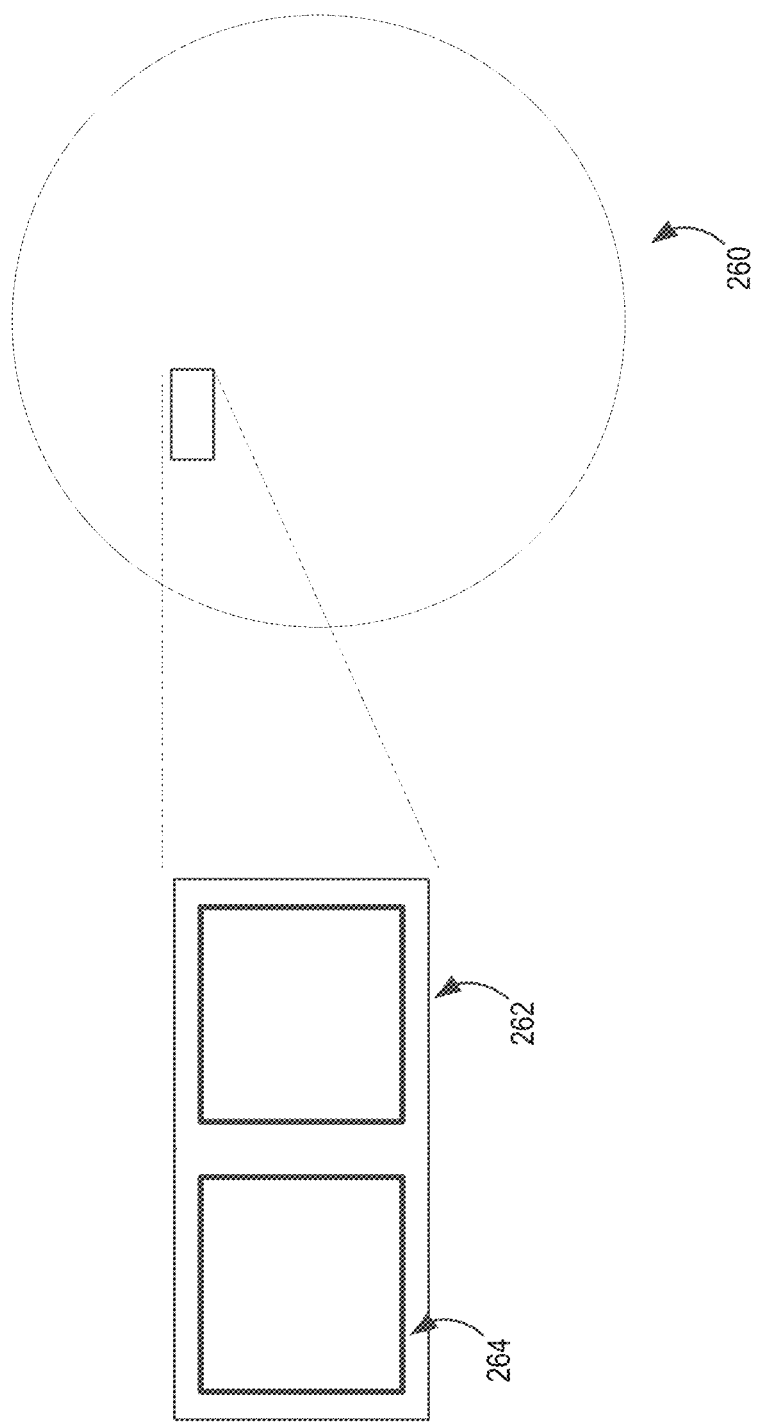
FIG. 2G is a schematic top view of a wafer with matching transistors according to an embodiment of the invention.

FIG. 2G is a schematic top view of a wafer 260 with monolithic transistors on a single die 262. The monolithic transistors each have an isolation layer 264 around the perimeter of each transistor. Because the monolithic transistors are on the same die 262, they can have matching characteristics. This matching can be achieved when the transistors are being grown adjacent to each other on the same wafer or substrate.

Figure 3A:
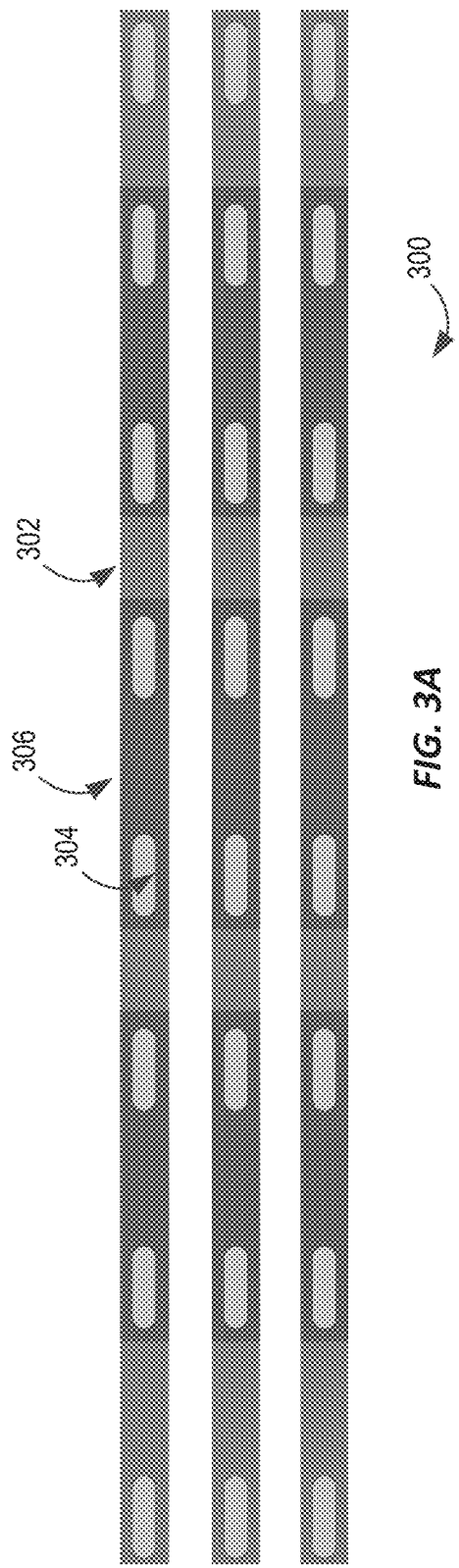
FIG. 3A is a schematic top view of an isolation layer.

FIG. 3A is a schematic top view of an isolation layer 300. The isolation layer 300 can comprise metal. For example, the isolation layer 300 of FIG. 3A has a first front side metal layer 302 on a substrate 304 and a second front side metal layer 306 on the first front side metal layer 302.

As shown in FIG. 3A, the isolation layer 300 includes rows of isolation. One benefit to the isolation layer 300 is to ensure that the same transistors from the same die will keep the matching characteristics provided. The isolation layer 300 ensures that RF performance does not deteriorate by mitigating coupling by adjacent transistors through the semiconductor substrate.

Figure 3B:
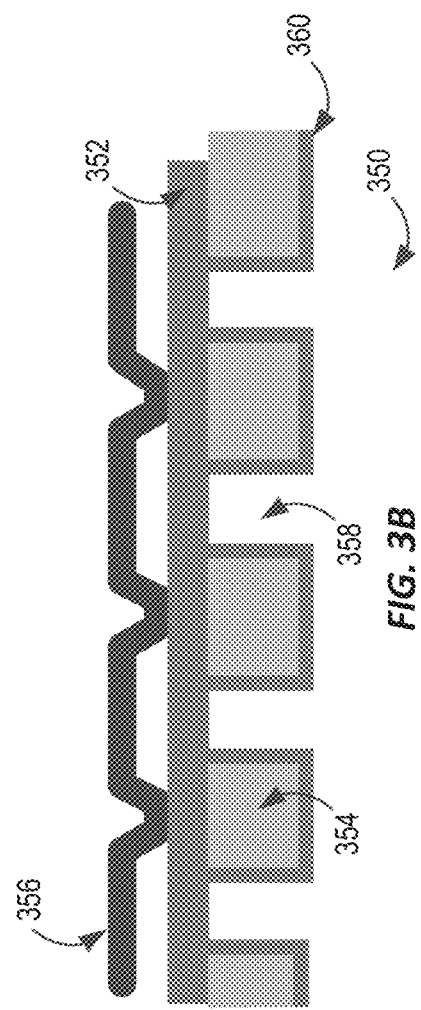
FIG. 3B is a schematic cross section view of an isolation layer.

FIG. 3B is a schematic cross section view of an isolation layer 350. Similar to the isolation layer 300 of FIG. 3A, isolation layer 350 has a first front side metal layer 352 on a substrate 354 and a second front side metal layer 356 on the first front side metal layer 352. Isolation layer 350 also includes through substrate vias 358 and a backside metal layer 360.

FIG. 3C is a three-dimensional view of an isolation layer 380. The isolation layer 380 is shown having three metal layers 382, 384, 386 with vias 388 that travel through each layer to connect to a grounding element (not shown).

FIG. 4A is a schematic top view of an isolation layer 400. The isolation layer 400 can comprise a substrate 402 that has recesses 404 in the substrate 402. As shown in FIG. 4A, the recesses in the isolation layer are staggered in rows.

FIG. 4B is a schematic cross section view of an isolation layer 410. Isolation layer 440 can comprise a substrate 412, a front side metal layer 414 and a backside metal layer 416. The substrate 410 can have recesses 418 on the backside. The recesses can be deep enough to provide insulation and shallow enough to provide mechanical strength for die handling.

FIG. 4C is an alternative schematic cross section view of an isolation layer 420. The isolation layer 420 can comprise recesses 422 on the topside of a substrate 424 and a backside metal layer 426. The recesses can be deep enough to provide insulation and shallow enough to provide mechanical strength for die handling.

Figure 4F:
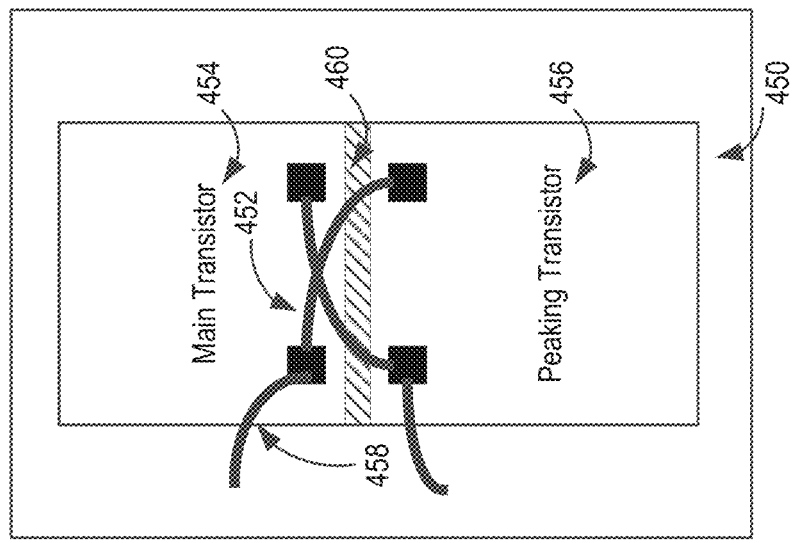
FIG. 4F is an alternative schematic cross section view of an isolation layer.
Figure 4E:
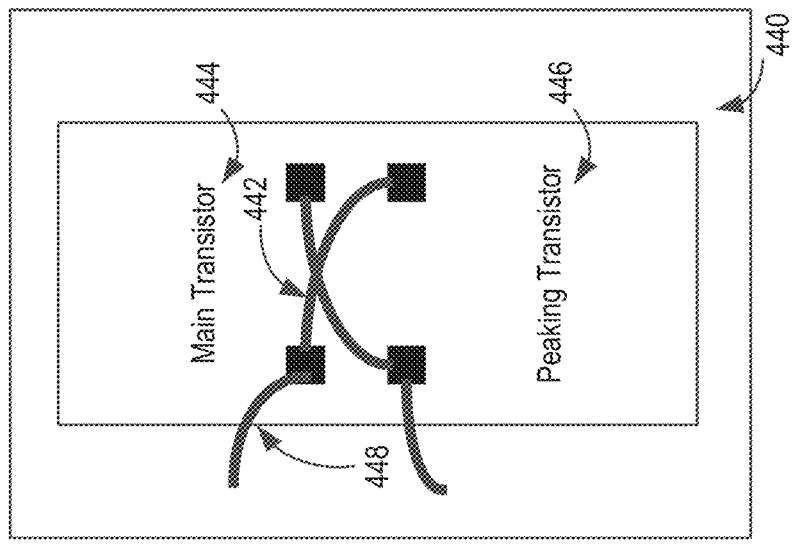
FIG. 4E is an alternative schematic cross section view of an isolation layer.
Figure 4D:
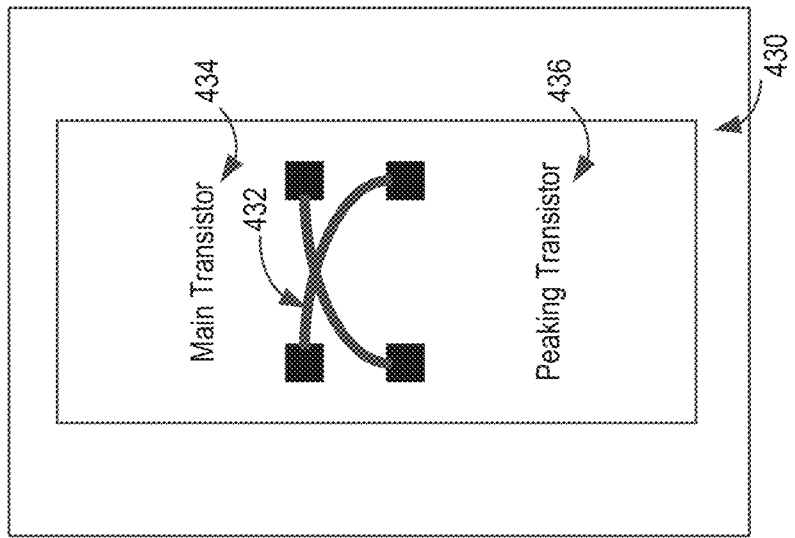
FIG. 4D is an alternative schematic cross section view of an isolation layer.

FIG. 4D is an amplifier 430 with a main transistor 434 and a peaking transistor 436. The amplifier 430 has an isolation structure shown in between the main transistor 434 and the peaking transistor 436. As shown, the isolation structure can include on-die wire bonds 432. The on-die wire bonds 432 can be attached to grounded pads.

FIG. 4E is an amplifier 440 with a main transistor 444 and a peaking transistor 446. The amplifier 440 has an isolation structure shown in between the main transistor 444 and the peaking transistor 446. As shown, the isolation structure can include on-die wire bonds 442 and off-die wire bonds 448. The wire bonds can be attached to grounded pads.

FIG. 4F is an amplifier 450 with a main transistor 454 and a peaking transistor 456. The amplifier 450 has an isolation structure shown in between the main transistor 454 and the peaking transistor 456. As shown, the isolation structure can include on-die wire bonds 452 and off-die wire bonds 458. The wire bonds can be attached to grounded pads. The isolation structure can also include a metal layer 460 on the front side of the amplifier 450. In some embodiments, the isolation structure can have at least one recess in the substrate in place of the metal layer 460.

Figure 5A:
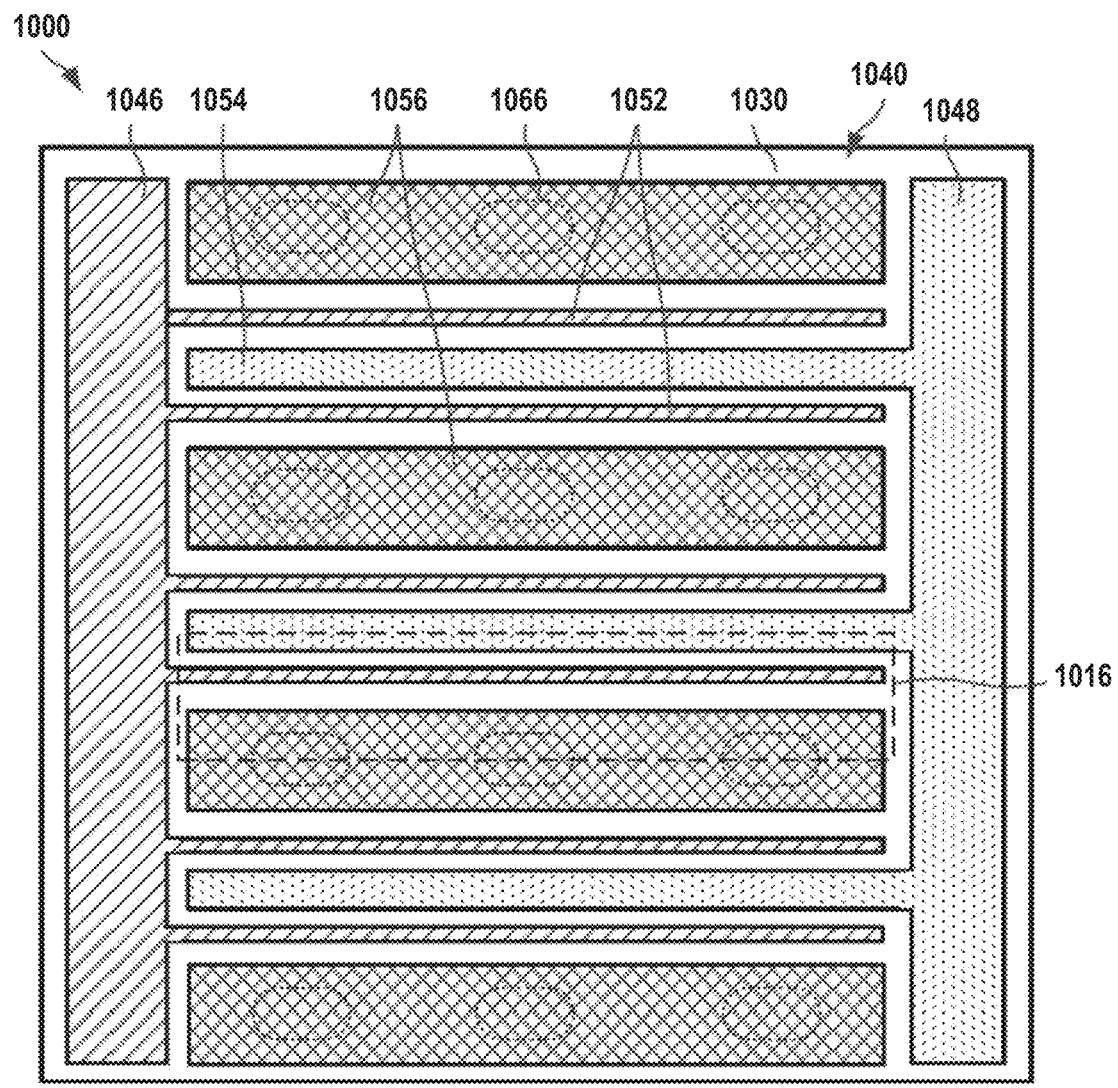
FIG. 5A is a schematic top of chip cross-sectional view of an RF amplifier die.

FIG. 5A is a schematic cross-sectional view of an RF amplifier die that is taken through a portion of a top side metallization structure. Dielectric layers that isolate the various conductive elements of the top-side metallization structure from each other are not shown in FIG. 5A to simplify the drawing.

As shown in FIG. 5A, the RF amplifier die 1000 comprises a Group III nitride-based HEMT RF amplifier that has a plurality of unit cell transistors 1016 that each include a gate finger 1052, a drain finger 1054 and a source finger 1056. The gate fingers 1052 are electrically connected to a common gate bus 1046, and the drain fingers 1054 are electrically connected to a common drain bus 1048. The gate bus 1046 is electrically connected to the gate terminal (e.g., through a conductive via that extends upwardly from the gate bus 1046) which is implemented as a gate bond pad, and the drain bus 1048 is electrically connected to the drain terminal (e.g., through a conductive via that extends upwardly from the drain bus 1048) which is implemented as a drain bond pad. The source fingers 1056 are electrically connected to the source terminal via a plurality of conductive source vias 1066 that extend through the semiconductor layer structure 1030. The conductive source vias 1066 may comprise metal-plated vias that extend completely through the semiconductor layer structure 1030.

Figure 5B:
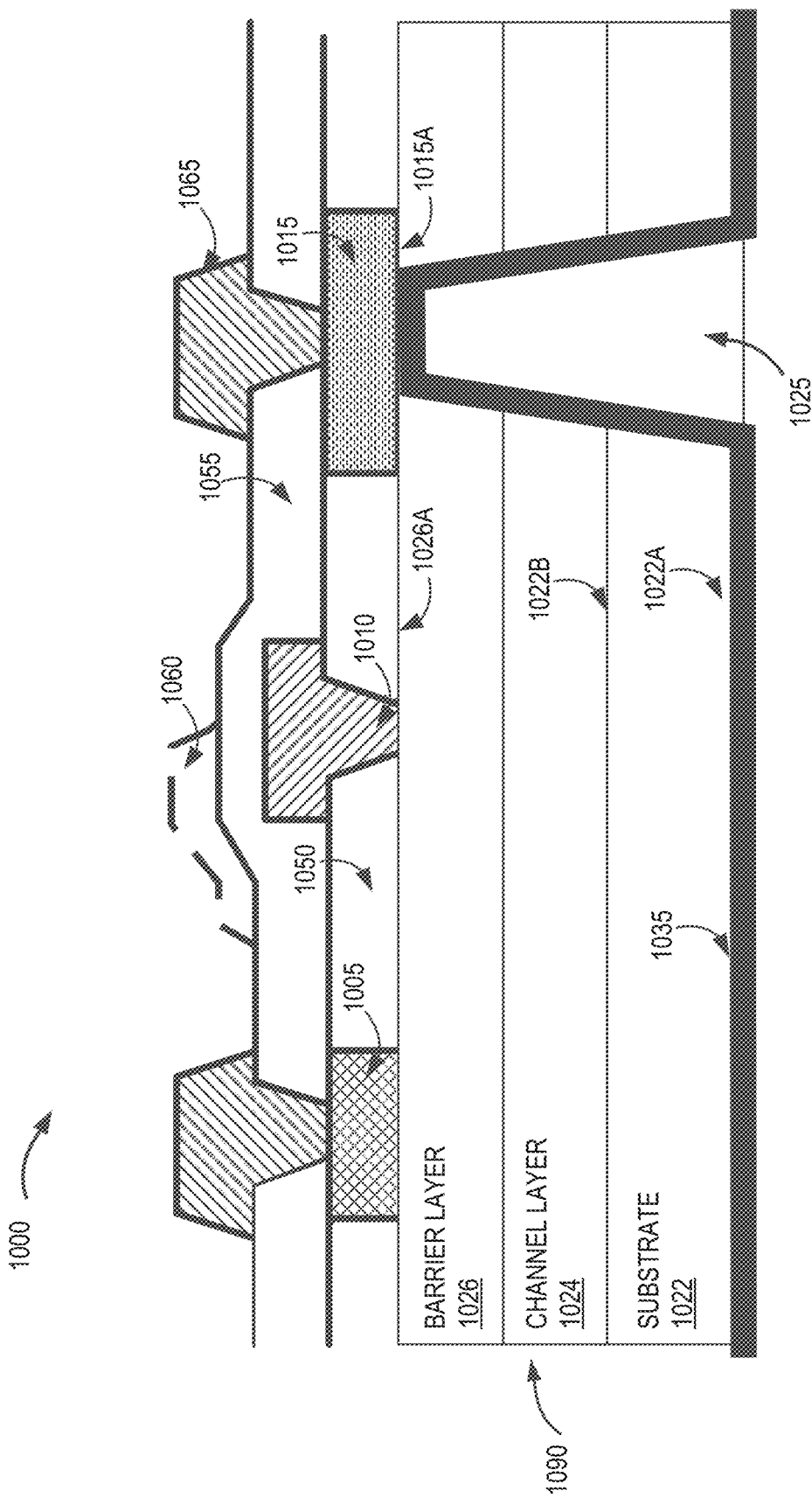
FIG. 5B is a schematic cross-sectional view of a conventional HEMT device.

FIG. 5B is a schematic cross-sectional view of a conventional HEMT device 1000. For example, FIG. 5B can be a cross section of FIG. 5A as outlined by the unit cell transistors 1016. A semiconductor structure 1090, such as a semiconductor structure for a Group III nitride semiconductor HEMT, may be formed on a substrate 1022 such as a SiC substrate, silicon substrate, or a sapphire substrate. The substrate 1022 may be a semi-insulating SiC substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

In some embodiments of the present invention, the SiC bulk crystal of the substrate 1022 may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention. Methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although SiC can be used as a substrate material, embodiments of the present application may utilize any suitable substrate. The substrate 1022 can be an SiC wafer, and the HEMT device 1000 can be formed, at least in part, via wafer-level processing, and the wafer can then be diced to provide a plurality of individual HEMTs 1000.

As shown in FIG. 5B, a channel layer 1024 is formed on an upper surface 1022B of the substrate 1022, and a barrier layer 1026 is formed on an upper surface of the channel layer 1024. The channel layer 1024 and the barrier layer 1026 can each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 1024 and the barrier layer 1026 can include Group III nitride-based materials.

While semiconductor structure 1090 is shown with channel layer 1024 and barrier layer 1026 for purposes of illustration, semiconductor structure 1090 can include additional layers/structures/elements such as a buffer and/or nucleation layer(s) between channel layer 1024 and substrate 1022, and/or a cap layer on barrier layer 1026. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 1022B of the substrate 1022 to provide an appropriate crystal structure transition between the SiC substrate 1022 and the reminder of the HEMT device 1000. Additionally, strain balancing transition layer(s) can also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 1015 and a drain contact 1005 can be formed on an upper surface 1026A of the barrier layer 1026 and can be laterally spaced apart from each other. A gate contact 1010 can be formed on the upper surface 1026A of the barrier layer 1026 between the source contact 1015 and the drain contact 1005. The material of the gate contact 1010 can be chosen based on the composition of the barrier layer 1026, and may, in some embodiments, be a Schottky contact.

The source contact 1015 can be coupled to a reference signal such as, for example, a ground voltage. The coupling to the reference signal can be provided by a via 1025 that extends from a lower surface 1022A of the substrate 1022, through the substrate 1022 to an upper surface 1026A of the barrier layer. The via 1025 can expose a bottom surface of the ohmic portion 1015A of the source contact 1015. A backmetal layer 1035 can be formed on the lower surface 1022A of the substrate 1022 and on the side walls of the via 1025. The backmetal layer 1035 can directly contact the ohmic portion 1015A of the source contact 1015. The backmetal layer 1035 and a signal coupled thereto can be electrically connected to the source contact 1015.

The HEMT device 1000 can include a first insulating layer 1050 and a second insulating layer 1055. The first insulating layer 1050 can directly contact the upper surface of the semiconductor structure 1090 (e.g., contact the upper surface 1026A of the barrier layer 1026). The second insulating layer 1055 can be formed on the first insulating layer 1050. It will also be appreciated that more than two insulating layers can be included in some embodiments. The first insulating layer 1050 and the second insulating layer 1055 can serve as passivation layers for the HEMT device 1000.

The source contact 1015, the drain contact 1005, and the gate contact 1010 can be formed in the first insulating layer 1050. In some embodiments, at least a portion of the gate contact 1010 can be on the first insulating layer. In some embodiments, the gate contact 1010 can be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 1055 can be formed on the first insulating layer 1050 and on portions of the drain contact 1005, gate contact 1010, and source contact 1015.

In some embodiments, field plates 1060 can be formed on the second insulating layer 1055. At least a portion of a field plate 1060 can be on the gate contact 1010. At least a portion of the field plate 1060 can be on a portion of the second insulating layer 1055 that is between the gate contact 1010 and the drain contact 1005. Field plates and techniques for forming field plates are discussed, by way of example, in U.S. Pat. No. 8,120,064, the disclosure of which is hereby incorporated herein in its entirety by reference.

Metal contacts 1065 can be disposed in the second insulating layer 1055. The metal contacts 1065 can provide interconnection between the drain contact 1005, gate contact 1010, and source contact 1015 and other parts of the HEMT device 1000. Respective ones of the metal contacts 1065 can directly contact respective ones of the drain contact 1005 and/or source contact 1015.

Figure 5C:
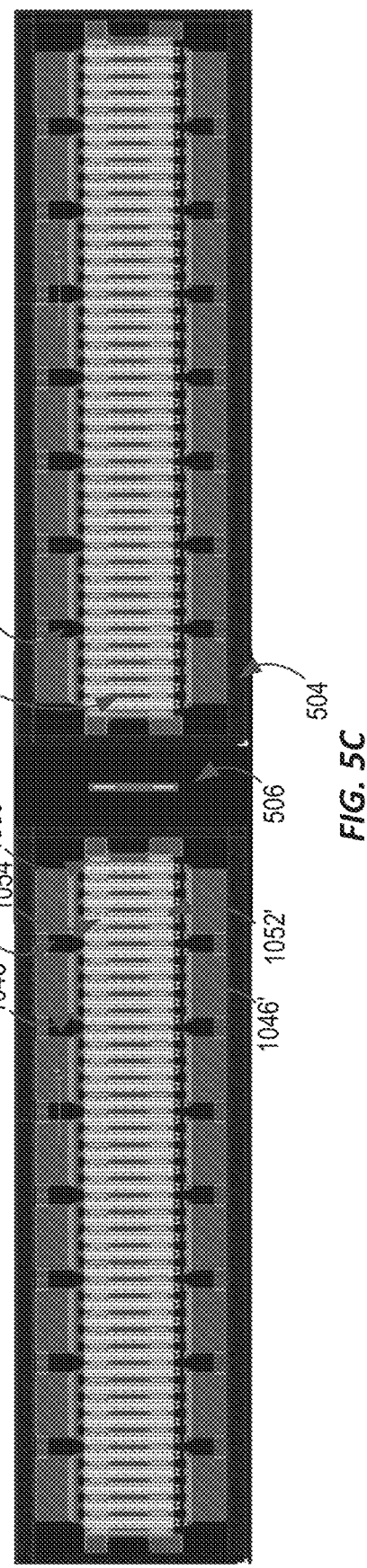
FIG. 5C is a schematic top view of two transistors separated by an isolation layer.

FIG. 5C is a schematic top view of two transistors 502A, 502B on a single die 504 separated by an isolation layer 506. Similar to FIG. 5A, the transistors each have a gate finger 1052', a drain finger 1054', and a source finger 1056'. The gate fingers 1052' are electrically connected to a common gate bus 1046', and the drain fingers 1054' are electrically connected to a common drain bus 1048'. The source fingers 1056' are electrically connected to the source terminal via a plurality of conductive source vias 1066'.

Similar to FIG. 3A, the isolation layer 506 can include a first front side metal layer on the substrate and a second front side metal layer on the first front side metal substrate. The isolation layer 506 can be formed across the die 504, or, as shown, across a portion of the die 504The isolation layer 506 can be present around the perimeter of each transistor 502A, 502B. The perimeter portion of the isolation layer 506 can be the same configuration and materials as the isolation layer 506 portion between the transistors 502A, 502B. Alternatively, the isolation layer 506 portions can be different configurations and/or different materials from each other.

Figure 5D:
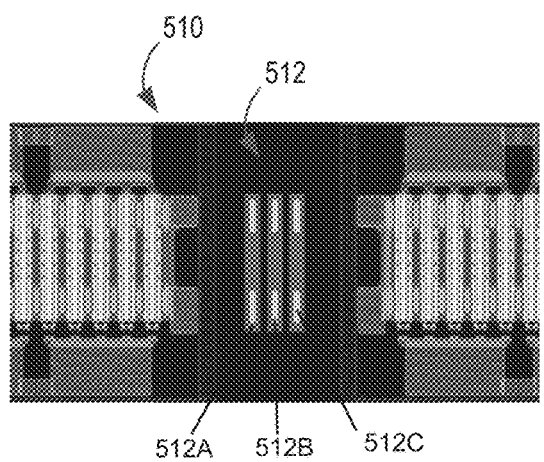
FIG. 5D is a schematic top view of two transistors separated by an isolation layer.

FIG. 5D is a schematic top view of two transistors 510 separated by an isolation layer 512 that is comprised of multiple isolation layers 512A, 512B, 512C. The isolation layer 512 can be similar to the isolation layer in FIG. 3A.

Figure 5E:
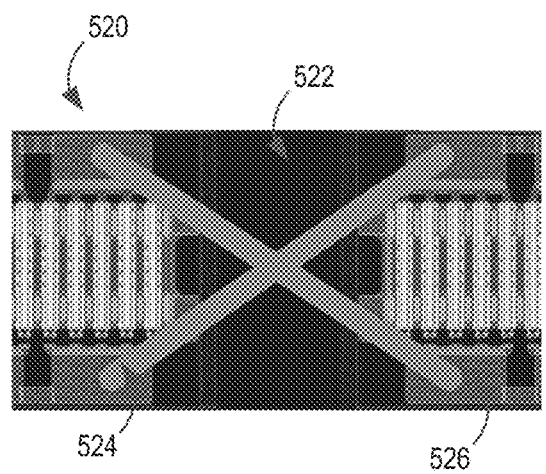
FIG. 5E is a schematic top view of two transistors separated by an isolation layer.

FIG. 5E is a schematic top view of two transistors 520 separated by an isolation layer 522. The isolation layer 522 can comprise a shielding structure with, for example, on-die wire bonds 524 attached to grounded pads 526. For example, arched metal shields between the two transistors 520 can mitigate a radiative RF pattern.

Figure 5F:
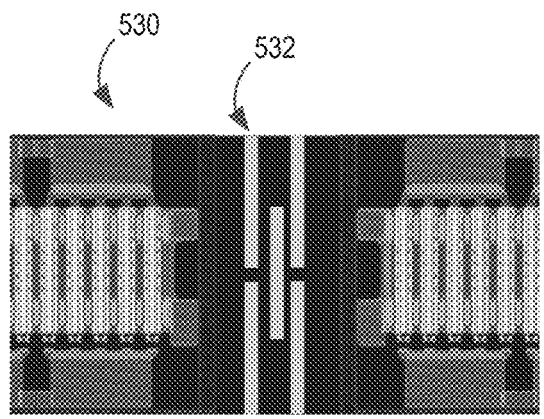
FIG. 5F is a schematic top view of two transistors separated by an isolation layer.

FIG. 5F is a schematic top view of two transistors 530 separated by an isolation layer 530. The isolation layer 530 can be similar to the isolation layer in FIG. 4A.

Figure 5G:
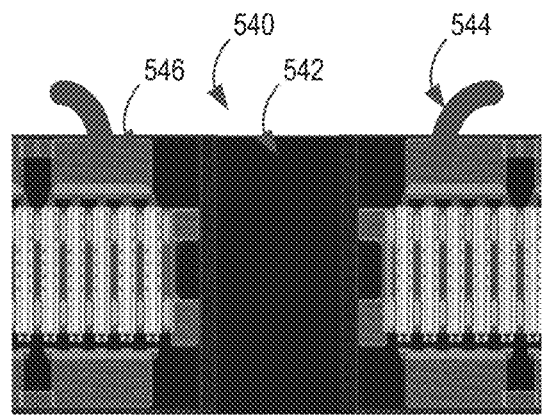
FIG. 5G is a schematic top view of two transistors separated by an isolation layer.

FIG. 5G is a schematic top view of two transistors 540 separated by an isolation layer 542. The isolation layer 542 can comprise off-die wire bonds 544 attached to grounded pads 546.

Figure 5H:
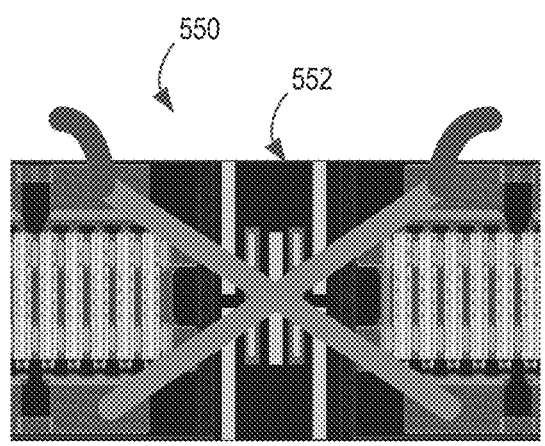
FIG. 5H is a schematic top view of two transistors separated by an isolation layer.

FIG. 5H is a schematic top view of two transistors 550 separated by an isolation layer 552. The isolation layer 552 can comprise various embodiments of isolation layers. For example, the isolation layer 552 can include the isolation layer 512 of FIG. 5B, the isolation layer 522 of FIG. 5E, the isolation layer 532 of FIG. 5F, and the isolation layer 542 of FIG. 5G.

Figure 6A:
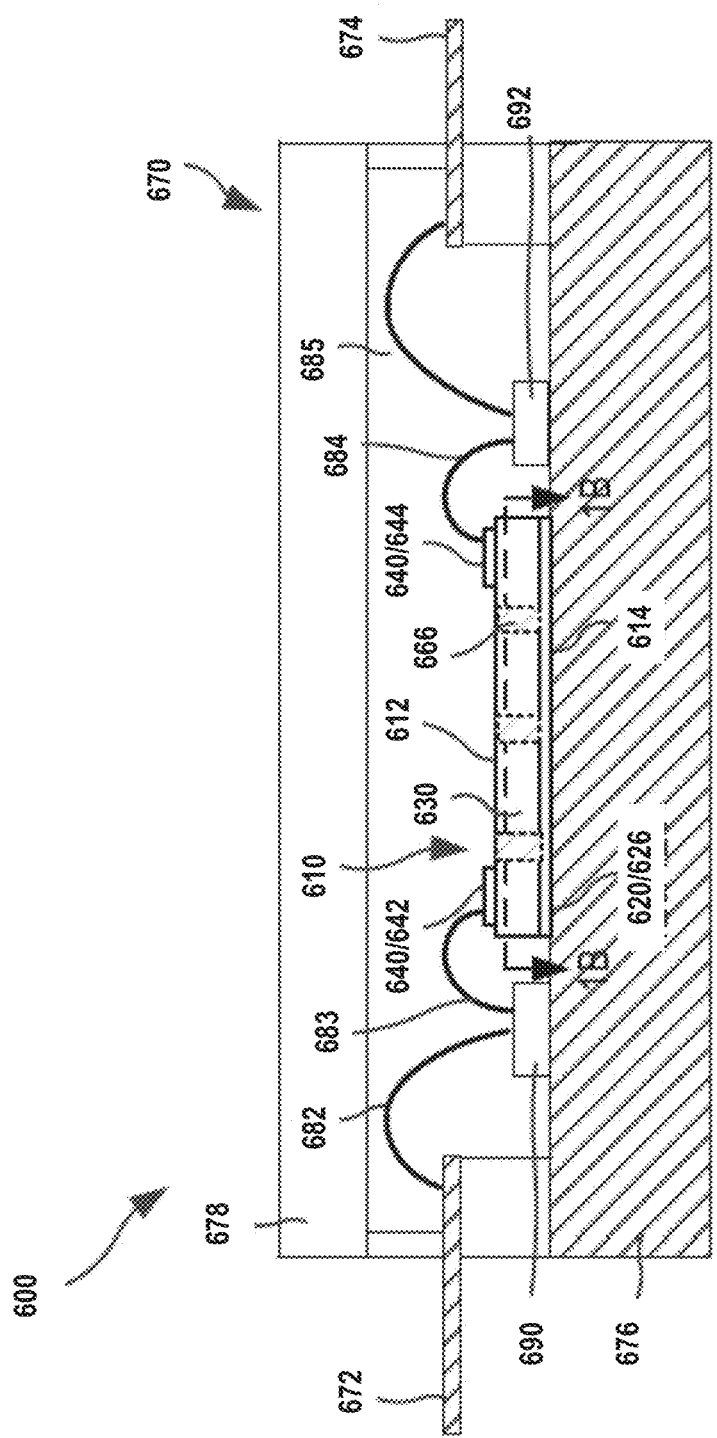
FIG. 6A is a conventional packaged RF amplifier schematic cross-section.
Figure 6B:
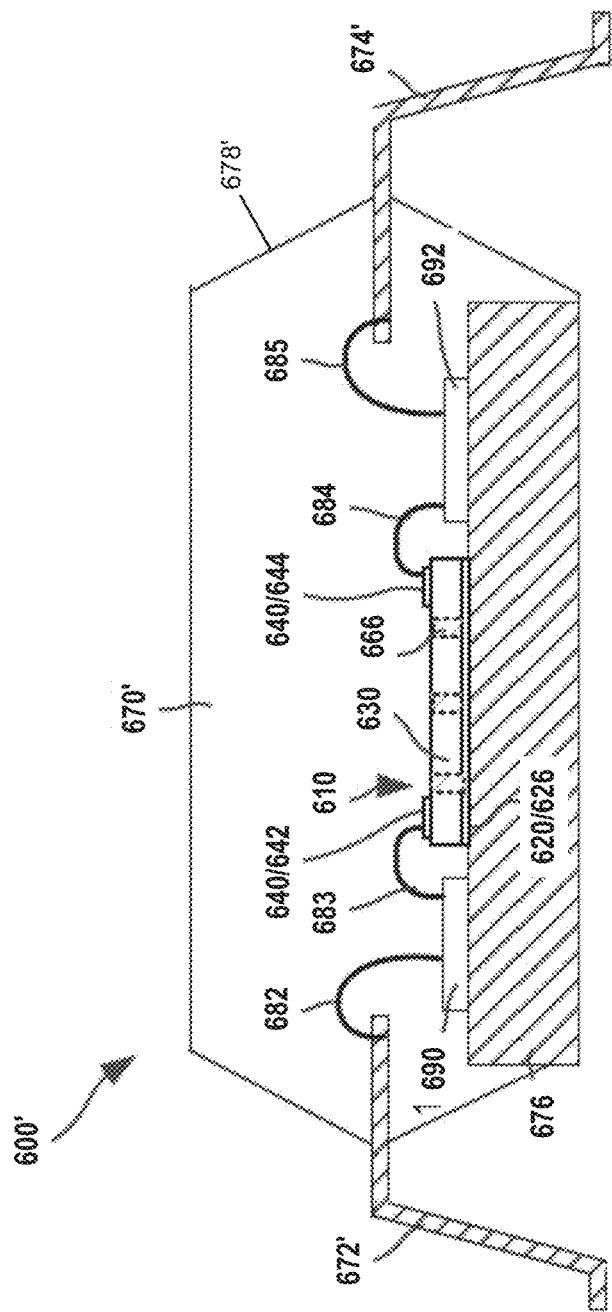
FIG. 6B is a schematic cross-sectional view of an RF amplifier die.
Figure 6C:
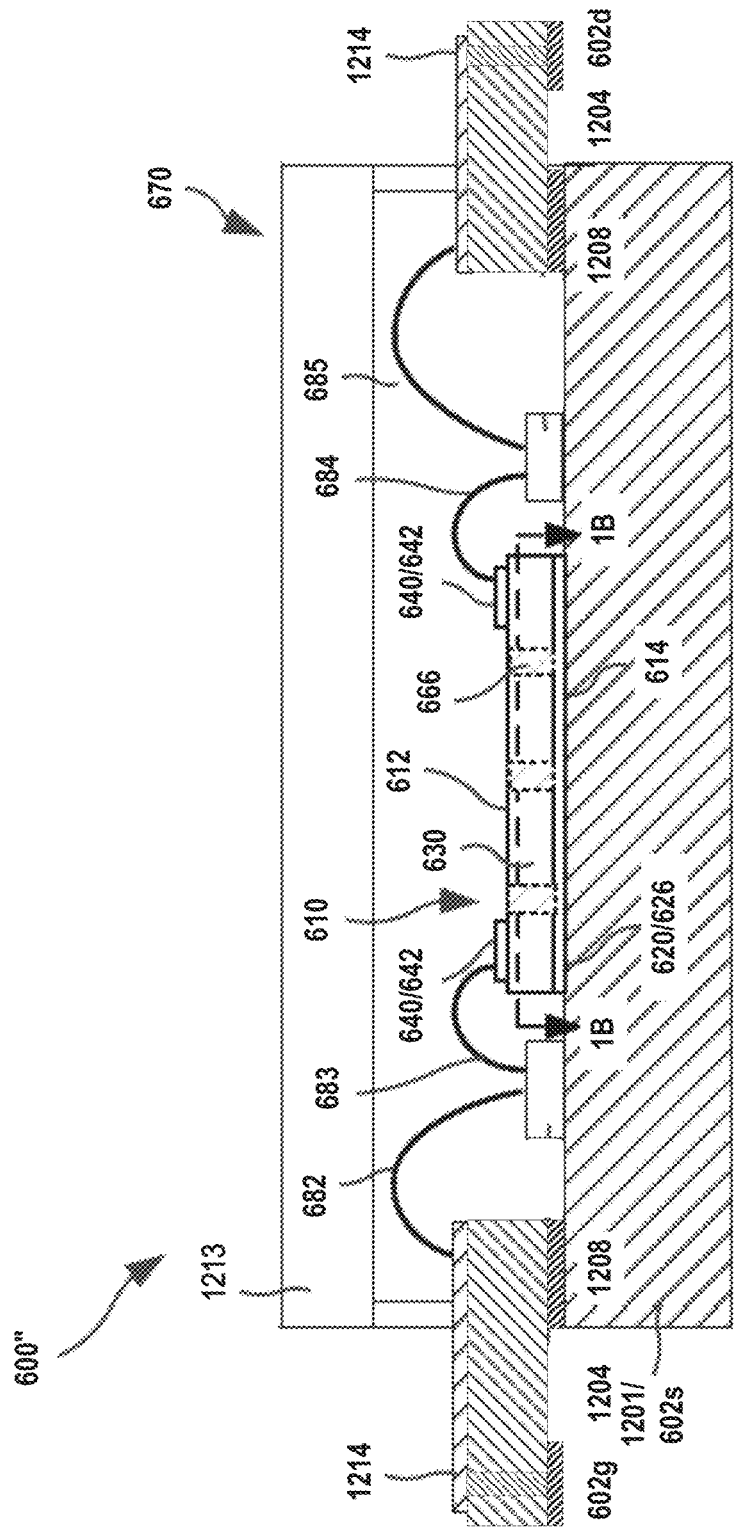
FIG. 6C is a cross-sectional view of a thermally enhanced IC device package.

Illustrated in FIGS. 5A-5H, embodiments of the invention can be implemented on chip as part of a monolithic device. FIGS. 6A-C show embodiments where the invention can be implemented on package.

As shown in FIG. 6A, the Group III nitride-based RF amplifier 600 includes an RF amplifier die 610 that is mounted within an open cavity package 670. The package 670 includes a gate lead 672, a drain lead 674, a metal flange 676 and a ceramic sidewall and lid 678. The RF transistor amplifier die 610 is mounted on the upper surface of the metal flange 676 in a cavity formed by the metal flange 676 and the ceramic sidewall and lid 678. The RF amplifier die 610 has a top side 612 and a bottom side 614. The RF amplifier die 610 includes a bottom side (also referred to as a "back" side) metallization structure 620, a semiconductor layer structure 630 and a top side metallization structure 640 that are sequentially stacked. The back side metallization structure 620 comprises a source terminal 626. The RF amplifier 600 may be a HEMT-based RF amplifier, in which case the semiconductor layer structure 630 may include at least a channel layer and a barrier layer, which are typically formed on a semiconductor or insulating growth substrate (such as a SiC or sapphire substrate). The top side metallization structure 640 includes, among other things, a gate terminal 642 and a drain terminal 644.

Input matching circuits 690 and/or output matching circuits 692 may also be mounted within the housing 670. The matching circuits 690, 692 may be impedance matching circuits that match the impedance of the fundamental component of RF signals input to or output from the RF transistor amplifier 600 to the impedance at the input or output of the RF transistor amplifier die 610, respectively, and/or harmonic termination circuits that are configured to short to ground harmonics of the fundamental RF signal that may be present at the input or output of the RF transistor amplifier die 610, such as second order or third order harmonics. As schematically shown in FIG. 6A, the input and output matching circuits 690, 692 may be mounted on the metal flange 676. The gate lead 672 may be connected to the input matching circuit 690 by one or more first bond wires 682, and the input matching circuit 690 may be connected to the gate terminal 642 of RF amplifier die 610 by one or more second bond wires 683. Similarly, the drain lead 674 may be connected to the output matching circuit 692 by one or more fourth bond wires 685, and the output matching circuit 692 may be connected to the drain terminal 644 of RF amplifier die 610 by one or more third bond wires 684. The source terminal 626 of RF transistor amplifier die 610 may be mounted directly on the metal flange 676. The metal flange 676 may provide the electrical connection to the source terminal 626 and may also serve as a heat dissipation structure. The first through fourth bond wires 682-685 may form part of the input and/or output matching circuits. The housing 678 may comprise a ceramic housing, and the gate lead 672 and the drain lead 674 may extend through the housing 678. The housing 678 may comprise multiple pieces, such as a frame that forms the lower portion of the sidewalls and supports the gate and drain leads 672, 674, and a lid that is placed on top of the frame. The interior of the device may comprise an air-filled cavity.

Referring again to FIG. 6A, the metal flange 676 may act as a heat sink that dissipates heat that is generated in the RF amplifier die 610. The heat is primarily generated in the upper portion of the RF amplifier die 610 where relatively high current densities are generated in, for example, the channel regions of the unit cell transistors 616. This heat may be transferred though both the source vias 666 and the semiconductor layer structure 630 to the metal flange 676.

FIG. 6B is a schematic side view of a conventional packaged Group III nitride-based RF transistor amplifier 600' that is similar to the RF transistor amplifier discussed above with reference to FIG. 6A. RF transistor amplifier 600' differs from RF transistor amplifier 600 in that it includes a different package 670'. The package 670' includes a metal submount 676 (which acts as a metal heat sink and can be implemented as a metal slug), as well as gate and drain leads 672', 674'. In some embodiments, a metal lead frame may be formed that is then processed to provide the metal submount 676 and/or the gate and drain leads 672', 674'. RF transistor amplifier 600' also includes a plastic overmold 678' that at least partially surrounds the RF transistor amplifier die 610, the leads 672', 674' and the metal submount 676. The plastic overmold 678' replaces the ceramic sidewalls and lid 678 included in RF transistor amplifier 600.

Depending on the embodiment, the packaged transistor amplifier 600' can include, for example, a monolithic microwave integrated circuit (MMIC) as the RF transistor amplifier die 610 in which case the RF transistor amplifier die 610 incorporates multiple discrete devices. When the RF transistor amplifier die 610 is a MMIC implementation, the input matching circuits 690 and/or the output matching circuits 692 may be omitted (since they may instead be implemented within the RF transistor amplifier die 610) and the bond wires 682 and/or 685 may extend directly from the gate and drain leads 672', 674' to the gate and drain terminals 642, 644. In some embodiments, the packaged RF transistor amplifier 600 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration.

In other cases, Group III nitride-based RF amplifiers may be implemented as monolithic microwave integrated circuit ("MMIC") devices in which one or more RF amplifier die(s) are implemented together with their associated impedance matching and harmonic termination circuits in a single, integrated circuit die. Examples of such Group III nitride-based RF amplifiers are disclosed, for example, in U.S. Pat. No. 9,947,616, the entire content of which is incorporated herein by reference.

FIG. 6C is a cross-sectional view illustrating an example of a thermally enhanced integrated circuit device package, more specifically a T3PAC package 1200. The T3PAC package 600" of FIG. 6C can be a ceramic-based package that includes a base 1201 and an upper housing with a lid member 1213 and sidewall members 1204. The lid member 1213 and sidewalls 1204 similarly define an open cavity surrounding the amplifier die 610 on the conductive base or flange 1201, which likewise provides both an attachment surface 1201 and thermal conductivity (e.g., a heat sink) for dissipating or otherwise transmitting heat outside of the package 600".

The flange 1201 can be an electrically conductive material, for example, a copper layer/laminate or an alloy or metal-matrix composite thereof. In some embodiments, the flange 1201 may include a copper-molybdenum (CuMo) layer, CPC(Cu/MoCu/Cu), or other copper alloys, such copper-tungsten CuW, and/or other laminate/multi-layer structures. In the example of FIG. 6C, the flange 1201 is illustrated as a copper-molybdenum (RCM60)-based structure to which the sidewalls 1204 and/or lid member 1213 are attached, e.g., by a conductive glue 1208.

The flange 1201 also provides the source lead 602s for the package 600". The gate lead 602g and drain lead 602d are provided by respective conductive wiring structure 1214 which is attached to the flange 1201 and supported by the sidewall members 1204.

Figure 7:
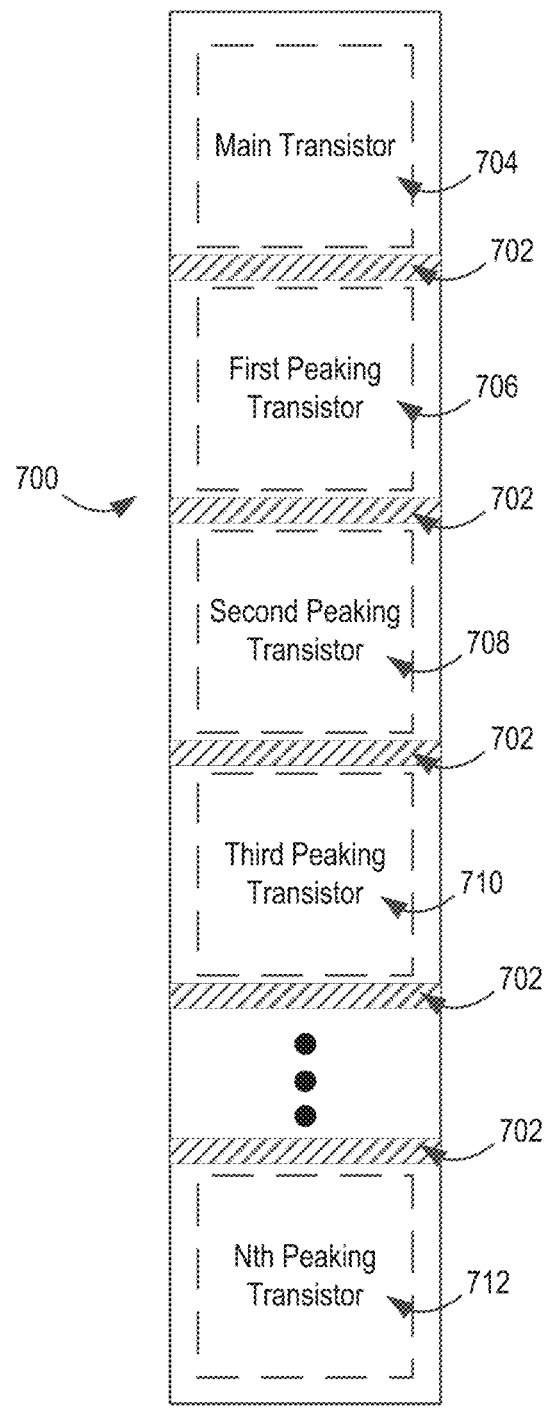
FIG. 7 is a schematic top view of an N-way RF power amplifier circuit with isolation layers.

FIG. 7 is a schematic top view of an N-way RF power amplifier circuit 700 with isolation layers 702. The isolation layers 702 can separate transistors. As shown, a main transistor 704 is separated from a first peaking transistor 706. A second transistor 708 is separated from the first peaking transistor 706 and a third peaking transistor 710. Isolation layers can separate any two transistors, as is shown with the Nth peaking transistor 712 being isolated as the last transistor on the N-way RF power amplifier circuit 700.

The isolation layer 702 can be formed across the circuit 700, as shown, or across a portion of the circuit 700. The isolation layer 702 can be present around the perimeter of each transistor 704-712. The perimeter portion of the isolation layer 702 can be the same configuration and materials as the isolation layer 702 portion between the transistors 704-712. Alternatively, the isolation layer 702 portions can be different configurations and/or different materials from each other.

In some embodiments, a peaking transistor can be a GaN based HEMT. In some embodiments, a main transistor can be a GaN based HEMT. In some embodiments, a transistor in the RF amplifier circuit 700 can be a laterally-diffused metal-oxide semiconductor field effect transistor (LDMOS). In some embodiments, the RF amplifier circuit 700 can be a package.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein. Although steps of various processes or methods described herein may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention.

What is claimed is:

1. A packaged Doherty amplifier comprising:
a substrate of a semiconductor device enclosed in a package;
a main transistor formed on the substrate; a first edge seal structure formed on the substrate and completely surrounding the main transistor;
a peaking transistor formed on the substrate;
a second edge seal structure formed on the substrate and completely surrounding the peaking transistor; and
wherein the first and second edge seal structures are configured to protect the respective transistors from chips or cracks, formed during a singulation process, from propagating into the active area of the transistors;
wherein the main and peaking transistors are monolithically integrated and the substrate containing both transistors and the first and second edge seal structures are packaged into the amplifier; and
wherein the first and second edge seal structures each comprise at least a first metal layer formed continuously on a front side of the substrate, a second metal layer formed on the first metal layer intermittently along its length, and a plurality of through vias connecting the first metal layer to a grounded conductor on a back side of the substrate.

2. The packaged Doherty amplifier of claim 1, further comprising on-die wire bonds on the substrate between the first and second edge seal structures.

3. The packaged Doherty amplifier of claim 1, further comprising:
a third transistor formed on the substrate; and a third edge seal structure formed on the substrate and completely surrounding the third transistor;
wherein the third transistor is monolithically integrated with the first and second transistors and the substrate containing the main, peaking, and third transistors and first, second, and third edge seal structures is packaged into the amplifier;
wherein the third edge seal structure is configured to protect the third transistor from chips or cracks formed during a singulation process from propagating into the active area of the transistor; and
wherein the third edge seal structure comprises at least a first metal layer formed on a front side of the substrate, a second metal layer formed on the first metal layer intermittently along its length, and a plurality of through vias connecting the first metal layer to a grounded conductor on a back side of the substrate.

4. The packaged Doherty amplifier of claim 1, wherein the main and peaking transistors are GaN-based High Electron Mobility Transistors ("HEMT").

5. The packaged Doherty amplifier of claim 1, wherein the first and second transistors are laterally diffused metal oxide semiconductor ("LDMOS") transistors.

6. The packaged Doherty amplifier of claim 1, wherein the amplifier operates at a frequency between 0.5 GHz and 1 GHz.

7. The packaged Doherty amplifier of claim 1, wherein the amplifier operates at a frequency of approximately 3 GHz.

8. The packaged Doherty amplifier of claim 1, wherein the amplifier operates at a frequency of approximately 10 GHz.

9. The packaged Doherty amplifier of claim 1, wherein the amplifier operates at a frequency between 12 GHz and 18 GHz.

10. The packaged Doherty amplifier of claim 1, wherein the amplifier operates at a frequency between 18 GHz and 27 GHz.

11. The packaged Doherty amplifier of claim 1, wherein the amplifier operates at a frequency between 27 GHz and 40 GHz.

12. The packaged Doherty amplifier of claim 1, further comprising an isolation structure formed on the substrate between the first and second edge seal structures.

13. The packaged Doherty amplifier of claim 12, wherein the isolation structure is a recessed isolation structure.

14. The packaged Doherty amplifier of claim 13, wherein the recessed isolation structure comprises at least two rows of recesses in the substrate.

15. The packaged Doherty amplifier of claim 14, wherein the rows are staggered.

16. The packaged Doherty amplifier of claim 13, wherein the recessed isolation structure is formed on one or both of the front side of the substrate and the back side of the substrate.

17. The packaged Doherty amplifier of claim 13, further comprising a metal layer on one or both of the front side of the substrate and the back side of the substrate.

18. The packaged Doherty amplifier of claim 12, wherein the isolation structure comprises a metal isolation structure and a recessed isolation structure.

19. The packaged Doherty amplifier of claim 12, wherein the isolation structure comprises at least a first metal layer formed on a front side of the substrate and a plurality of through vias connecting the metal layer to a grounded conductor on a back side of the substrate.

20. The packaged Doherty amplifier of claim 19, wherein the first metal layer of the isolation structure comprises a first row generally transverse to an axis between the main and peaking transistors.

21. The packaged Doherty amplifier of claim 20, wherein the isolation structure further comprises a second row formed on front side of the substrate.

22. The packaged Doherty amplifier of claim 21, wherein the through vias of the first and second rows are staggered.

23. The packaged Doherty amplifier of claim 20, wherein the isolation structure covers a portion of the width of the substrate.

24. The packaged Doherty amplifier of claim 20, wherein the isolation structure covers the width of the substrate.

25. The packaged Doherty amplifier of claim 19, wherein the isolation structure further comprises on-die wire bonds.

26. The packaged Doherty amplifier of claim 1, wherein the second metal layer is formed on the first metal layer in a serpentine pattern.

* * * * *